(12) United States Patent
Lai

(10) Patent No.: US 11,424,406 B2
(45) Date of Patent: Aug. 23, 2022

(54) GENERATING SELF-ALIGNED HEATER FOR PCRAM USING FILAMENTS

(71) Applicant: Taiwan Semiconductor Manufacturing Company, Ltd., Hsinchu (TW)

(72) Inventor: Sheng-Chih Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 29 days.

(21) Appl. No.: 16/787,387

(22) Filed: Feb. 11, 2020

(65) Prior Publication Data

US 2021/0249593 A1  Aug. 12, 2021

(51) Int. Cl.
*H01L 45/00* (2006.01)
*G11C 13/00* (2006.01)

(52) U.S. Cl.
CPC ............ *H01L 45/06* (2013.01); *G11C 13/003* (2013.01); *G11C 13/0004* (2013.01); *G11C 13/0011* (2013.01); *H01L 45/1253* (2013.01); *H01L 45/141* (2013.01); *H01L 45/1608* (2013.01)

(58) Field of Classification Search
CPC . H01L 45/06; H01L 45/1253; H01L 45/1608; H01L 45/141; G11C 13/0011; G11C 13/0004; G11C 13/003
See application file for complete search history.

(56) References Cited

U.S. PATENT DOCUMENTS

| | | | |
|---|---|---|---|
| 7,560,721 B1 | 7/2009 | Breitwisch et al. | |
| 8,493,772 B2 | 7/2013 | Liu | |
| 2009/0275168 A1 | 11/2009 | Breitwisch et al. | |
| 2009/0278111 A1 | 11/2009 | Pop | |
| 2014/0264243 A1 | 9/2014 | Hong et al. | |
| 2015/0280119 A1 | 10/2015 | Hsu et al. | |
| 2019/0140173 A1 | 5/2019 | Huang et al. | |
| 2020/0194667 A1* | 6/2020 | Park | H01L 27/2409 |
| 2021/0050518 A1* | 2/2021 | Gong | H01L 45/1286 |
| 2021/0066395 A1* | 3/2021 | Navarro | H01L 45/12 |
| 2021/0135105 A1* | 5/2021 | Chen | H01L 45/145 |

FOREIGN PATENT DOCUMENTS

| | | |
|---|---|---|
| JP | 2015185842 A | 10/2015 |
| KR | 20190053078 A | 5/2019 |
| TW | 201214816 A | 4/2012 |

\* cited by examiner

*Primary Examiner* — Jerome Leboeuf
(74) *Attorney, Agent, or Firm* — Slater Matsil, LLP

(57) ABSTRACT

A method includes forming a bottom electrode, forming a dielectric layer, forming a Phase-Change Random Access Memory (PCRAM) region in contact with the dielectric layer, and forming a top electrode. The dielectric layer and the PCRAM region are between the bottom electrode and the top electrode. A filament is formed in the dielectric layer. The filament is in contact with the dielectric layer.

20 Claims, 20 Drawing Sheets

GENERATING SELF-ALIGNED HEATER FOR PCRAM USING FILAMENTS

BACKGROUND

Phase change memories may use chalcogenide semiconductors for storing states. The chalcogenide semiconductors have a crystalline state and an amorphous state. In the crystalline state, the phase change materials have a low resistivity, while in the amorphous state they have a high resistivity. The resistivity ratios of the phase change materials in the amorphous and crystalline states are typically greater than 1,000, and thus the phase change memory devices are unlikely to have erroneous reading. The chalcogenide materials are stable at certain temperature ranges in both crystalline and amorphous states and can be switched back and forth between the two states by electric pulses.

Phase change memories has several operating and engineering advantageous features, including high speed, low power, non-volatility, high density, and low cost. For example, phase change memories are non-volatile and may be written-into rapidly, for example, within less than about 50 nanoseconds. The Phase change memory cells may have a high density. In addition, phase change memories are compatible with CMOS logic and can generally be produced at a low cost compared to other types of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
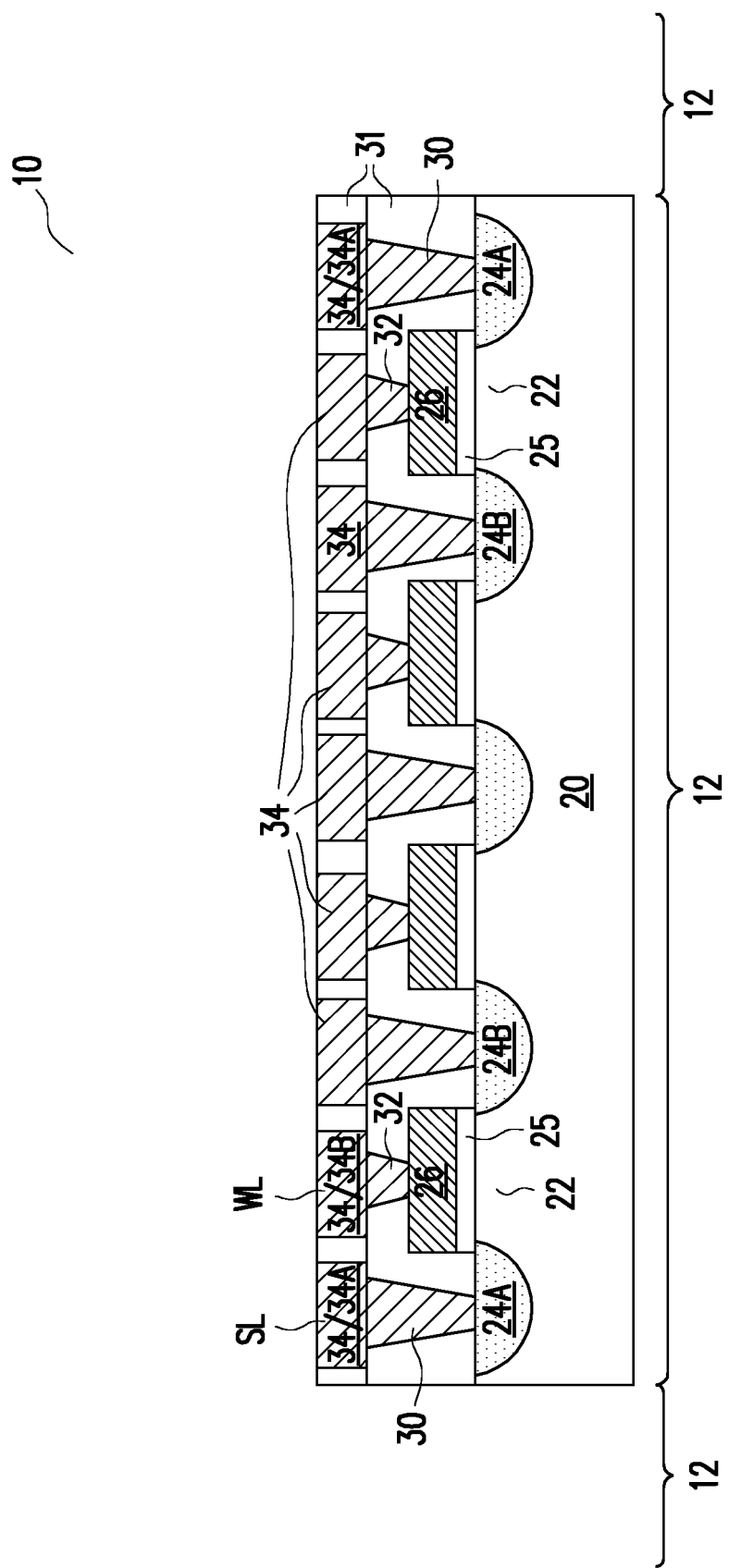
FIGS. 1 through 8 illustrate the cross-sectional views of intermediate stages in the formation of Phase-Change Random Access Memory (PCRAM) cells including self-aligned heaters in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phase-Change Random Access Memory (PCRAM) cells with self-aligned Resistive Random Access Memory (ReRAM) heaters and the method of forming the same are provided in accordance with some embodiments. The intermediate stages in the formation of the memory cells are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, PCRAM cells are formed adjoining dielectric layers, which are configured to be used as Resistive Random Access Memory (ReRAM) cells. Before or after the formation of the dies or wafers in which the PCRAM cells are located, filament formation processes are performed to form filaments in the dielectric layers. The filaments are connected in series with the PCRAM cells. The filaments have relatively high resistance, and are used as the heaters of the PCRAM cells. The filaments are self-aligned to the corresponding PCRAM cells.

Figure 20:
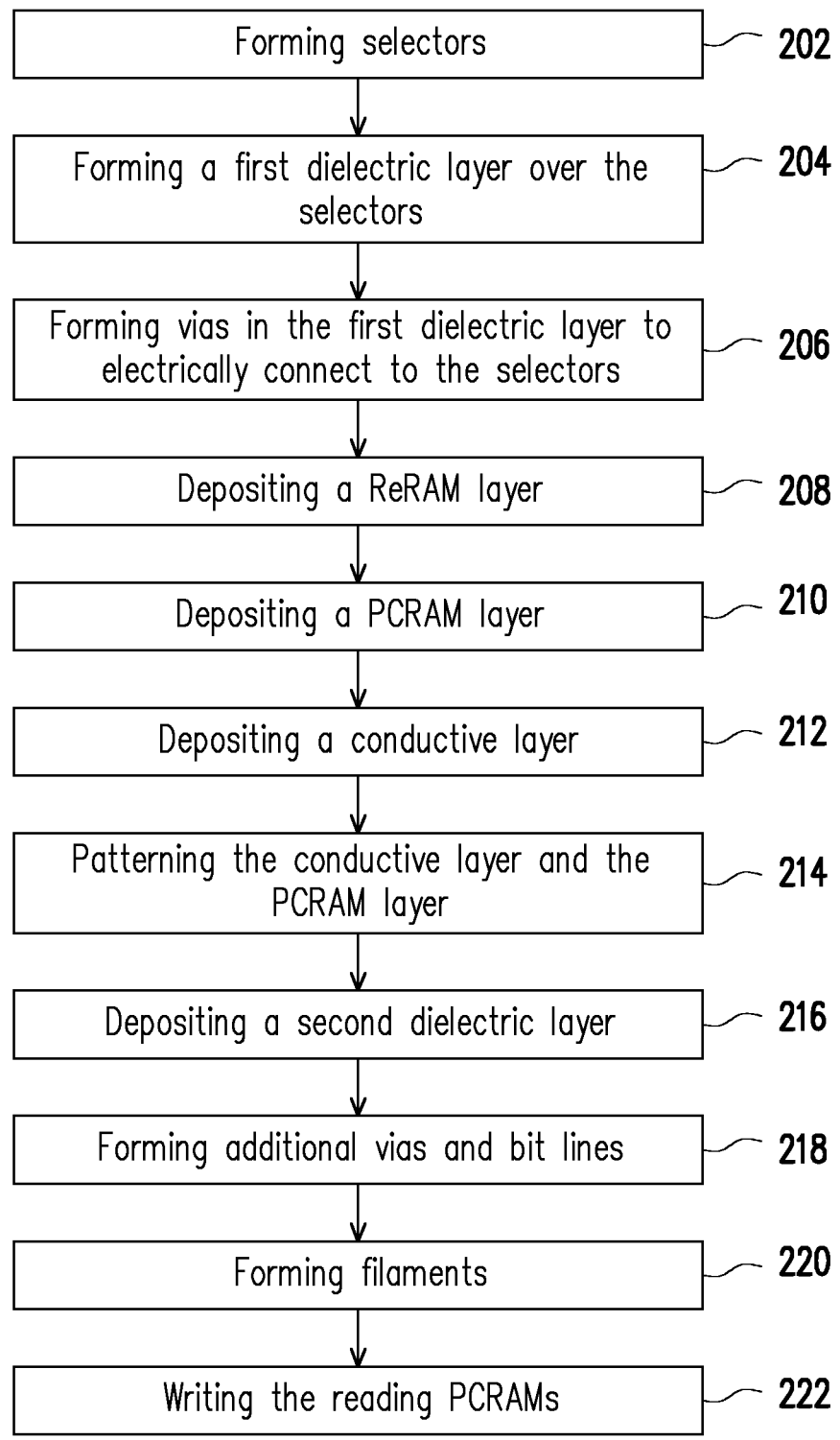
FIG. 20 illustrates a process flow for forming PCRAM cells in accordance with some embodiments.

FIGS. 1 through 9 illustrate the cross-sectional views of intermediate stages in the formation of PCRAM cells and the read/write operations of the PCRAM cells in accordance with some embodiments of the present disclosure. The corresponding processes are also reflected schematically in the process flow shown in FIG. 20.

FIG. 1 illustrates the cross-sectional view of wafer 10, which comprises a plurality of device dies 12. Wafer 10 includes substrate 20 therein. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. In accordance with some embodiments, the semiconductor material of semiconductor substrate 20 may include silicon; germanium; a compound semiconductor including silicon carbide, SiPC, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Transistors are formed on the front surface of semiconductor substrate 20. In accordance with some embodiments, the transistors include selectors 22, which include gate dielectrics 25, gate electrodes 26, source; drain regions 24A and 24B, and contact plugs (vias) 30 and 32. The respective process is illustrated as process 202 in the process flow 200 shown in FIG. 20. Source/drain regions 24A and 24B may extend into semiconductor substrate 20. Gate electrodes 26 and contact plugs 30 and 32 may be formed in dielectric layer(s) 31, which may include an Inter-Layer Dielectric (ILD), and may or may not include an Inter-Metal Dielectric (IMD). In accordance with some embodiments of the present disclosure, dielectric layers 31 are formed of low-k dielectric materials having dielectric constants (k-values) lower than about 3.0 or lower. Dielectric layers 31 may be formed of Black Diamond (a registered trademark of Applied Materials), a carbon-containing low-k dielectric material (such as SiOC (with pores therein)), Hydrogen SilsesQuioxane (HSQ), MethylSilsesQuioxane (MSQ), or the like. In accordance with some embodiments of the present disclosure, the formation of dielectric layers 31 includes depositing a porogen-containing dielectric material and then performing a curing process to drive out the porogen, and hence the remaining dielectric layers 31 is porous. Dielectric layers 31 may also be formed of silicon oxide, Phospho-Silicate Glass (PSG), Boro-Silicate Glass (BSG), Boron-Doped Phospho-Silicate Glass (BPSG), Undoped Silicate Glass (USG), or like.

Metal lines 34 are formed in dielectric layers 31. In accordance with some embodiments, each of metal lines 34 includes a diffusion barrier layer and a copper-containing material over the respective diffusion barrier layer. The diffusion barrier layer may be formed of titanium, titanium nitride, tantalum, tantalum nitride, or the like, and has the function of preventing copper in copper-containing material from diffusing into dielectric layer 31. Metal lines 34 may have a single damascene structure, a dual damascene structure, or the like. The formation of metal lines 34 may include etching the corresponding dielectric layer 31 to form trenches, depositing a blank diffusion barrier layer extending into the trenches, depositing a conductive material to fully fill the trenches, and performing a planarization process. The portion of the conductive material and the blanket diffusion barrier layer outside of the trenches are removed by the planarization process, hence leaving metal lines 34 in the respective dielectric layer 31. The copper-containing material may comprise substantially pure copper (for example, with the copper having atomic percentage greater than 90 percent) or a copper alloy.

Figure 2:
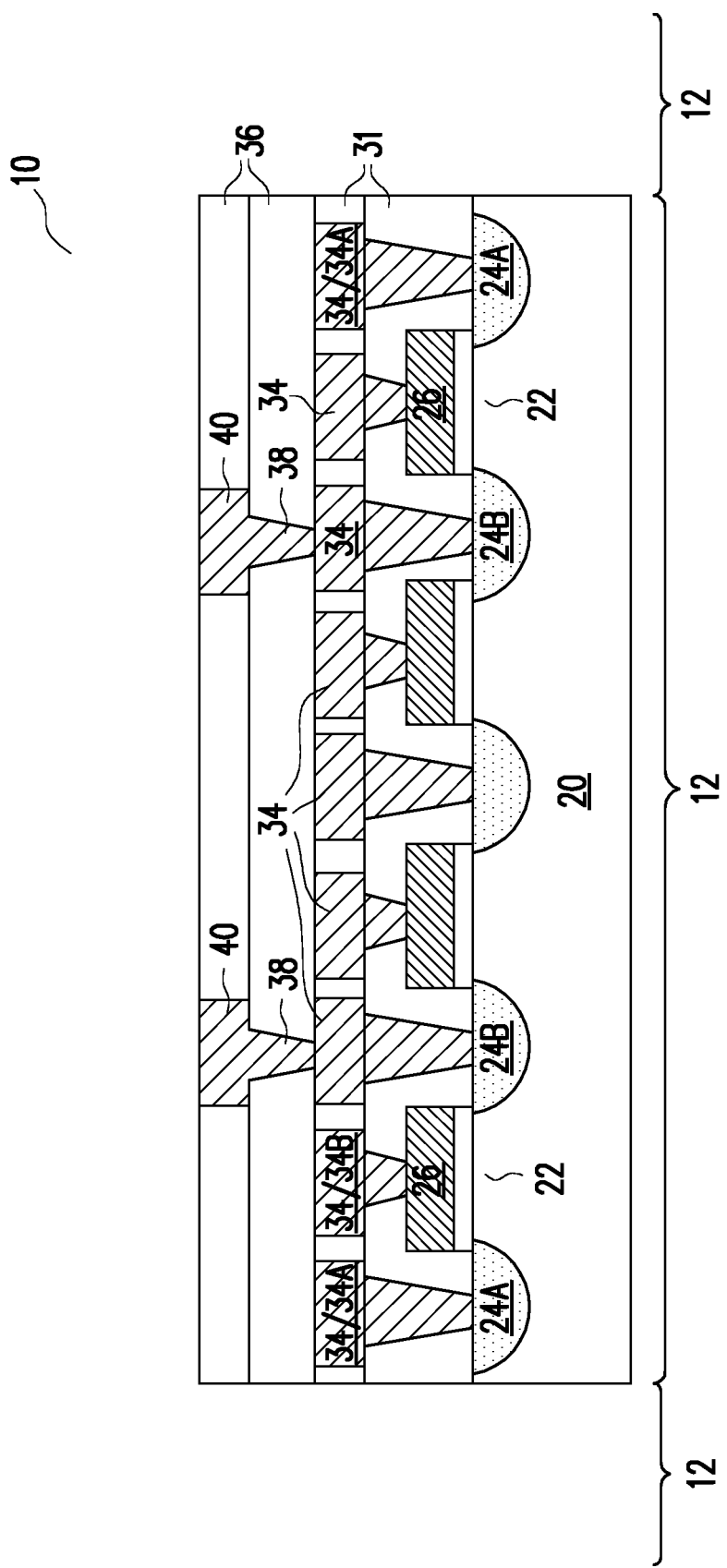

FIG. 2 illustrates the formation of more dielectric layers and metal lines, vias, and pads over and electrically connecting to the selectors 22. In accordance with some embodiments, the dielectric layers include dielectric layers 36, which may be Inter-Metal Dielectric (IMD) layers. Dielectric layers 36 may be formed of low-k dielectric materials in accordance with some embodiments. Metal lines 40 and vias 38 may be formed in the dielectric layers 36. Metal lines 40 and vias 38 may be formed using single damascene or dual damascene processes. It is appreciated that although one metal layer (with metal lines 40 at the same level collectively referred to as being a metal layer) is illustrated as an example, there may be more than one metal layer formed. Alternatively, the subsequently formed vias 44 (FIG. 3) may be formed directly on metal lines 34.

Figure 3:
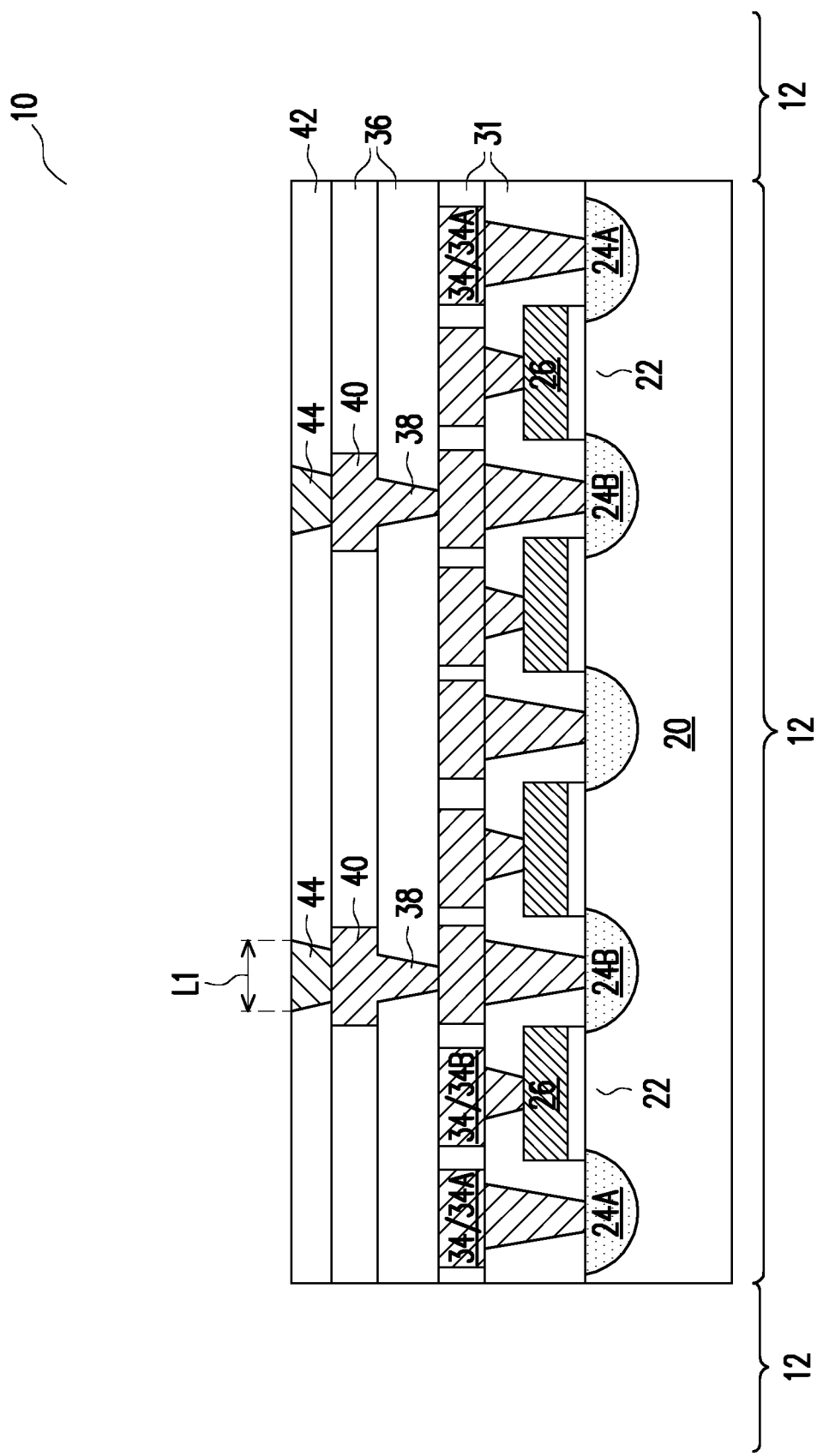

FIG. 3 illustrates the formation of dielectric layer 42. The respective process is illustrated as processes 204 in the process flow 200 shown in FIG. 20. In accordance with some embodiments of the present disclosure, dielectric layer 42 is formed of silicon oxide, silicon carbide, silicon oxynitride, silicon oxycarbide, or the like. Alternatively, dielectric layer 42 may be formed of a low-k dielectric material, which may be an oxygen-and-carbon containing low-k dielectric material, HSQ, MSQ, or the like.

Further referring to FIG. 3, conductive vias 44 are formed in dielectric layer 42. The respective process is illustrated as process 206 in the process flow 200 shown in FIG. 20. In accordance with some embodiments, conductive vias 44 are formed of or comprise metals, which may include tungsten, cobalt, copper, nickel, or the like, or alloys thereof. Conductive vias 44 may also include conductive barriers and metal regions (such as copper regions) on the conductive barriers. The formation of conductive vias 44 may include forming openings in dielectric layer 42, filling the openings with the conductive materials, and performing a planarization process such as a Chemical Mechanical Polishing (CMP) process or a mechanical grinding process to level the top surfaces of vias 44 and dielectric layer 42. In accordance with some embodiments, vias 44 have round or rectangular (such as a square) top-view shapes. The sizes of vias 44 are small enough to limit where the filaments (heaters) are to be formed, and vias 44 are preferably small. On the other hand, the sizes of the heaters are not related to the size of vias 44, and hence vias 44 may be formed large enough so that there is no process difficulty. In accordance with some embodiments, the lateral dimension L1 (which may be the length or diameter, for example) of vias 44 may be in the range between about 20 nm and about 100 nm.

Figure 4:
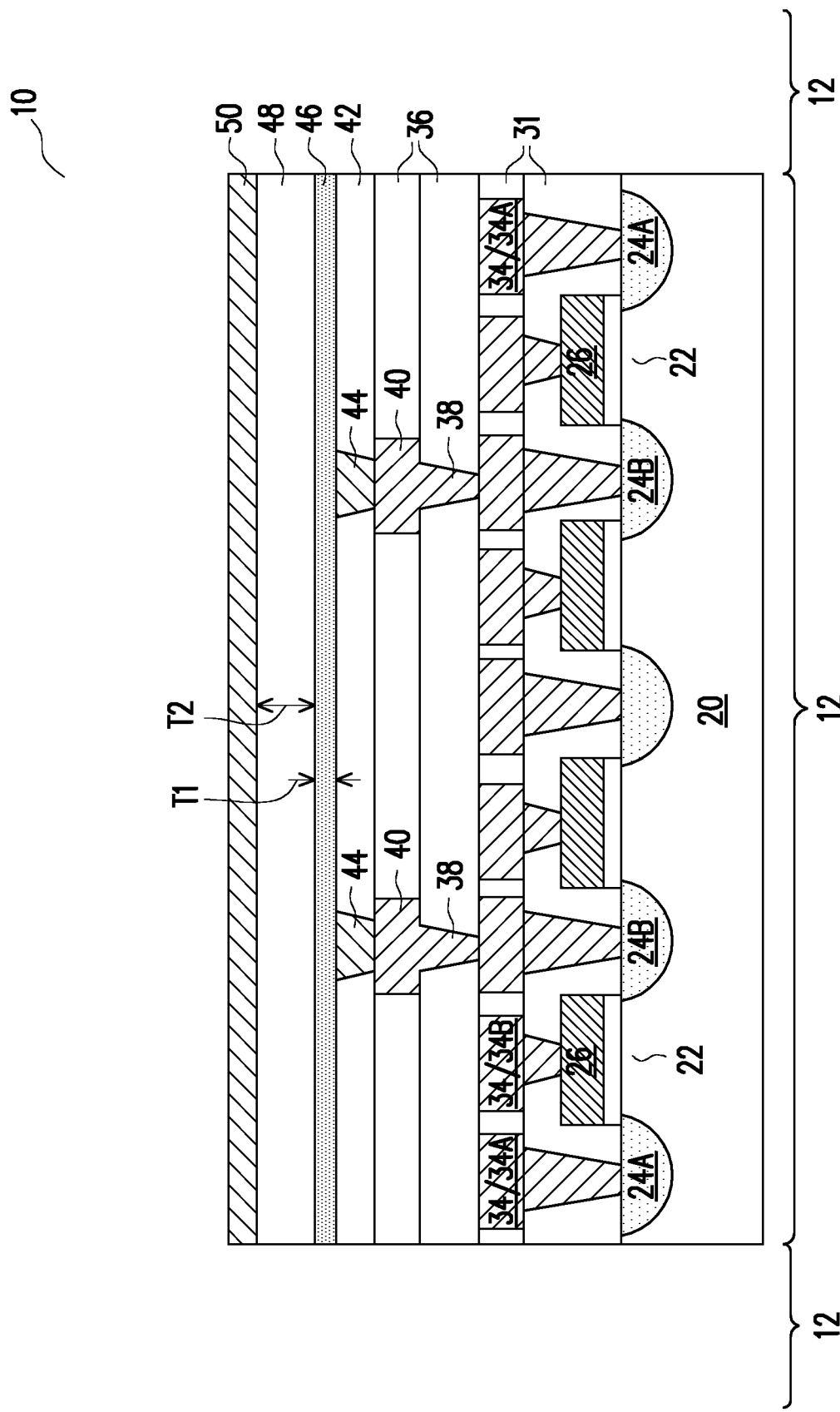

FIG. 4 illustrates the deposition of ReRAM layer 46 in accordance with some embodiments. The respective process is illustrated as process 208 in the process flow 200 shown in FIG. 20. ReRAM layer 46 is formed of a dielectric material that is configured to be able to have a conductive filament(s) formed therein through applying an appropriate electrical field. For example, ReRAM layer 46 may be formed of or comprise a metal-containing high-k dielectric material, which may be a metal oxide. The metal may be a transitional metal. In accordance with some embodiments of the present disclosure, ReRAM layer 46 is formed of or comprise $HfO_x$, $ZrO_x$, $TaO_x$, $TiO_x$, $VO_x$, $NiO_x$, $NbO_x$, $LaO_x$, or combinations thereof. The thickness T1 of ReRAM layer 46 is small, so that the voltage required for forming the filaments in ReRAM 46 is low. For example, thickness T1 may be in the range between about 3 nm and about 10 nm. ReRAM layer 46 may be formed through Atomic Layer Deposition (ALD), Chemical Vapor Deposition (CVD), or the like.

Over ReRAM layer 46, PCRAM layer 48 is deposited over and contacting ReRAM layer 46. The respective process is illustrated as process 210 in the process flow 200 shown in FIG. 20. PCRAM layer 48 may be formed of or comprise a chalcogenide material, which may be $Ge_xSb_yTe_z$, wherein x, y and z indicate the ratio of the respective elements. In accordance with some embodiments, x is about 2, y is about 2, and z is about 5. PCRAM layer 48 may have thickness T2 in the range between about 5 nm and about 150 nm. In accordance with some embodiments, the formation process (such as the temperature and the deposition rate) of PCRAM layer 48 is controlled so that PCRAM layer 48 is at crystalline state. Accordingly, PCRAM layer 48 has a lower resistivity (comparing the resistivity at the amorphous state). For example the resistivity of PCRAM layer 48 at the crystalline state may be in the range between about 1E−5 Ω·cm and about 5E−3 Ω·cm. In accordance with alternative embodiments, the phase change material of PCRAM layer 48 can be symbolized as $Ge_xSb_yTe_zX$, wherein X is a material selected from Ag, Sn, In, Si, N, and combinations thereof. PCRAM layer 48 may also be formed using Physical Vapor Deposition (PVD), Plasma Enhanced Chemical Vapor Deposition (PECVD), CVD, or the like. The temperature for forming PCRAM layer 48 may be in the range between about −40° C. and about 400° C.

Over PCRAM layer 48, conductive layer 50 (which is also referred to as a top electrode layer) is deposited. The respective process is illustrated as process 212 in the process flow 200 shown in FIG. 20. In accordance with some embodiments, top electrode layer 50 is formed of a conductive material, which may include tungsten, nickel, cobalt, aluminum, or the like. Top electrode layer 50 may also include an adhesive layer such as a titanium layer, and an aluminum copper layer over the titanium layer. The formation method may include Physical Vapor Deposition (PVD), CVD, Metal Organic Chemical Vapor Deposition (MOCVD), or the like.

Figure 5:
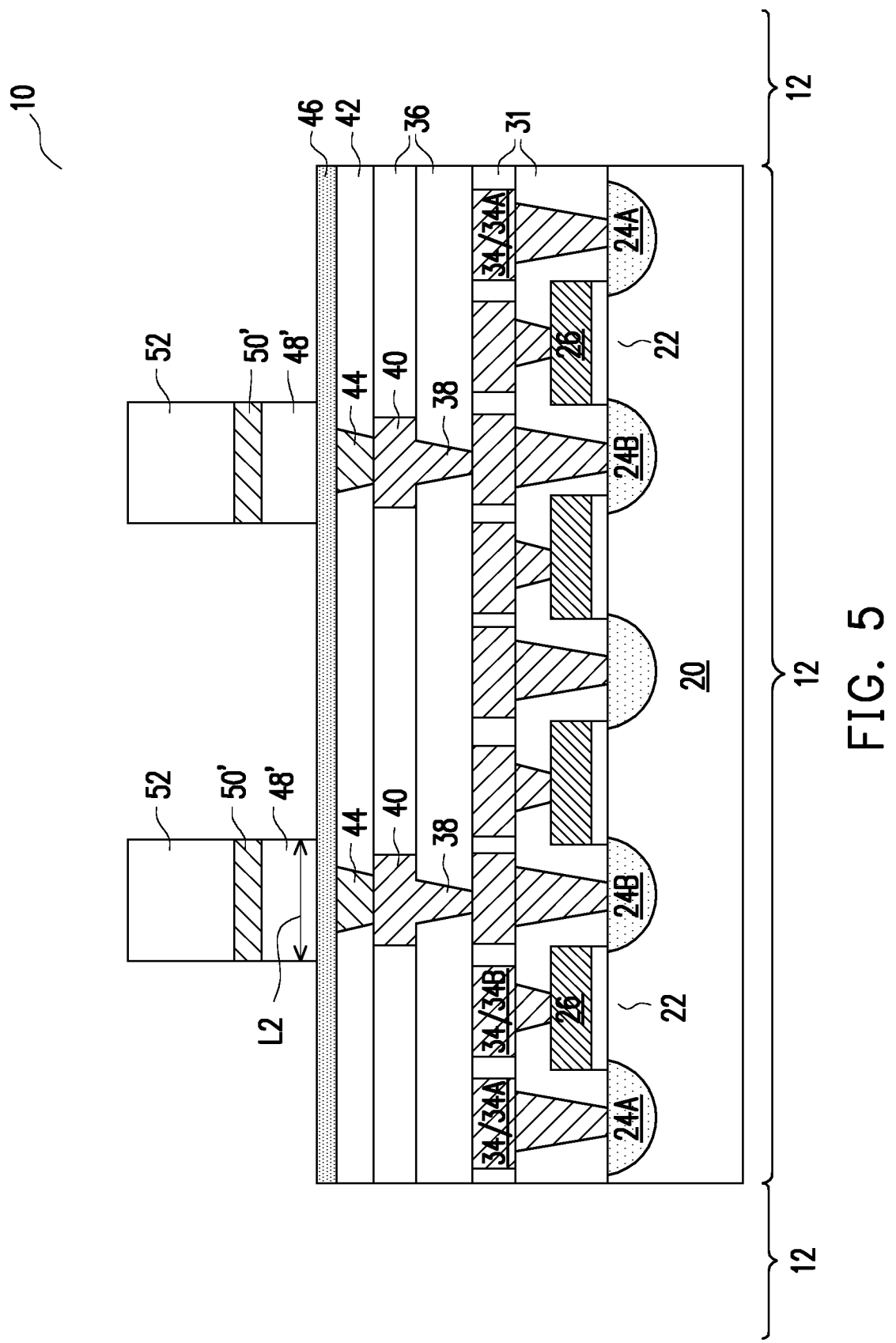
Figure 19:
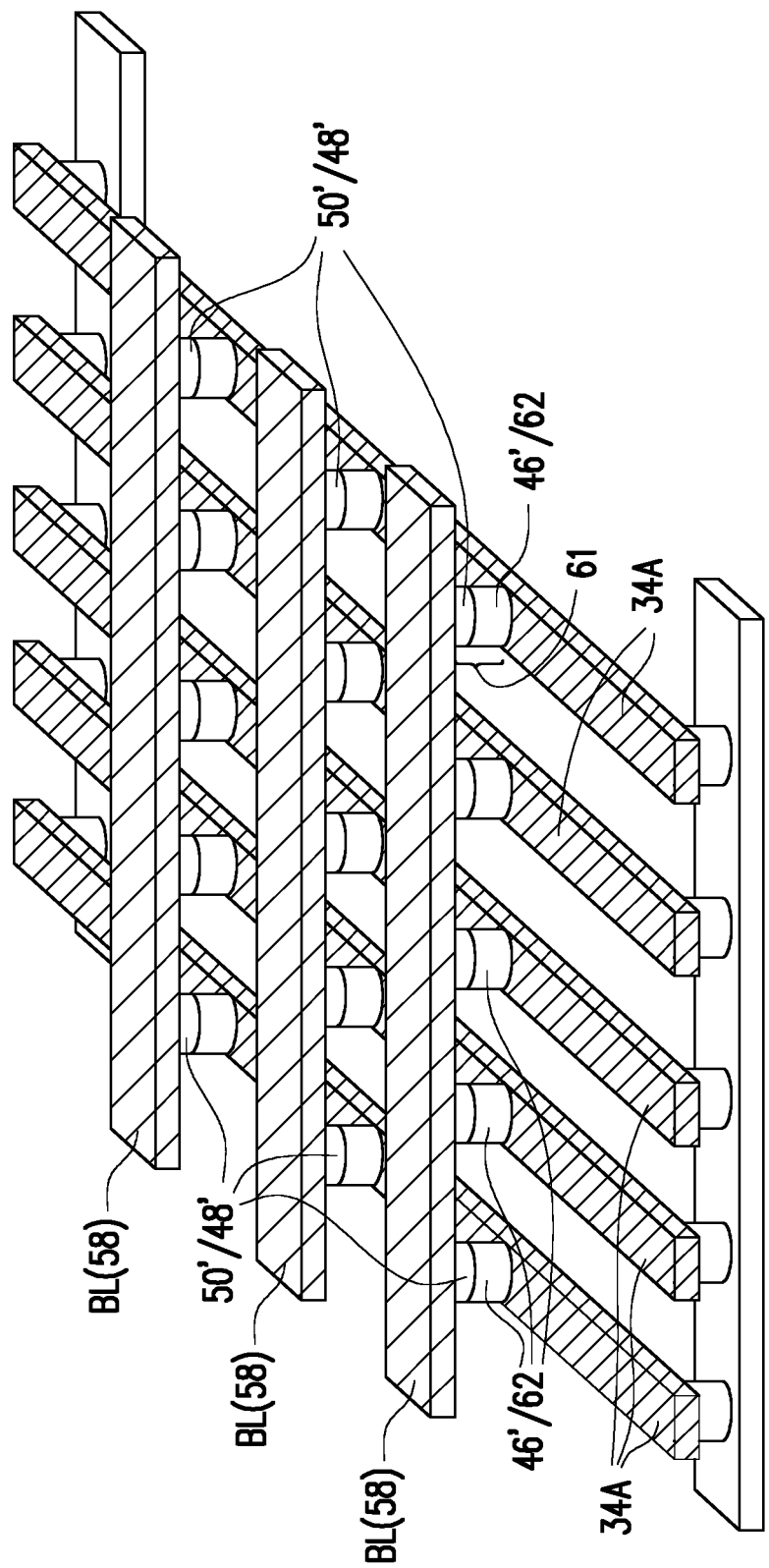
FIG. 19 illustrates a perspective view of a PCRAM array in accordance with some embodiments.

FIG. 5 illustrates the patterning of top electrode layer 50 and PCRAM layer 48 to form top electrodes 50' and phase-change elements 48', respectively. The respective process is illustrated as process 214 in the process flow 200 shown in FIG. 20. In accordance with some embodiments, the patterning process includes forming a patterned etching mask 52, which may be formed of photo resist, and may or may not include a hard mask such as a titanium nitride layer, and then etching top electrode layer 50 and PCRAM layer 48 using the patterned etching mask 52 to define patterns. After the etching process, etching mask 52 is removed. The resulting top electrodes 50' and phase-change elements 48' may form an array, as illustrated in FIG. 19. The patterning may be performed using ReRAM layer 46 as an etch stop layer. It is appreciated that over-etch may occur when phase-change elements 48' is patterned. As a result, the exposed portions of ReRAM layer 46, which portions are exposed after the overlying portions of PCRAM layer 48 are removed in the patterning, may be thinned. As a result, the portions of ReRAM layer 46 directly underlying phase-change elements 48' may be thicker than the thinned portions of ReRAM layer 46. After the patterning process, ReRAM layer 46 is still a blanket layer that spans throughout the entire PCRAM array. In accordance with some embodiments, the lateral dimension L2 (which may be the length, width, or diameter, for example) of top electrodes 50' and phase-change elements 48' may be in the range between about 30 nm and about 110 nm. Lateral dimension L2 may be greater than lateral dimension L1 by a difference greater than about 10 nm.

Figure 6:
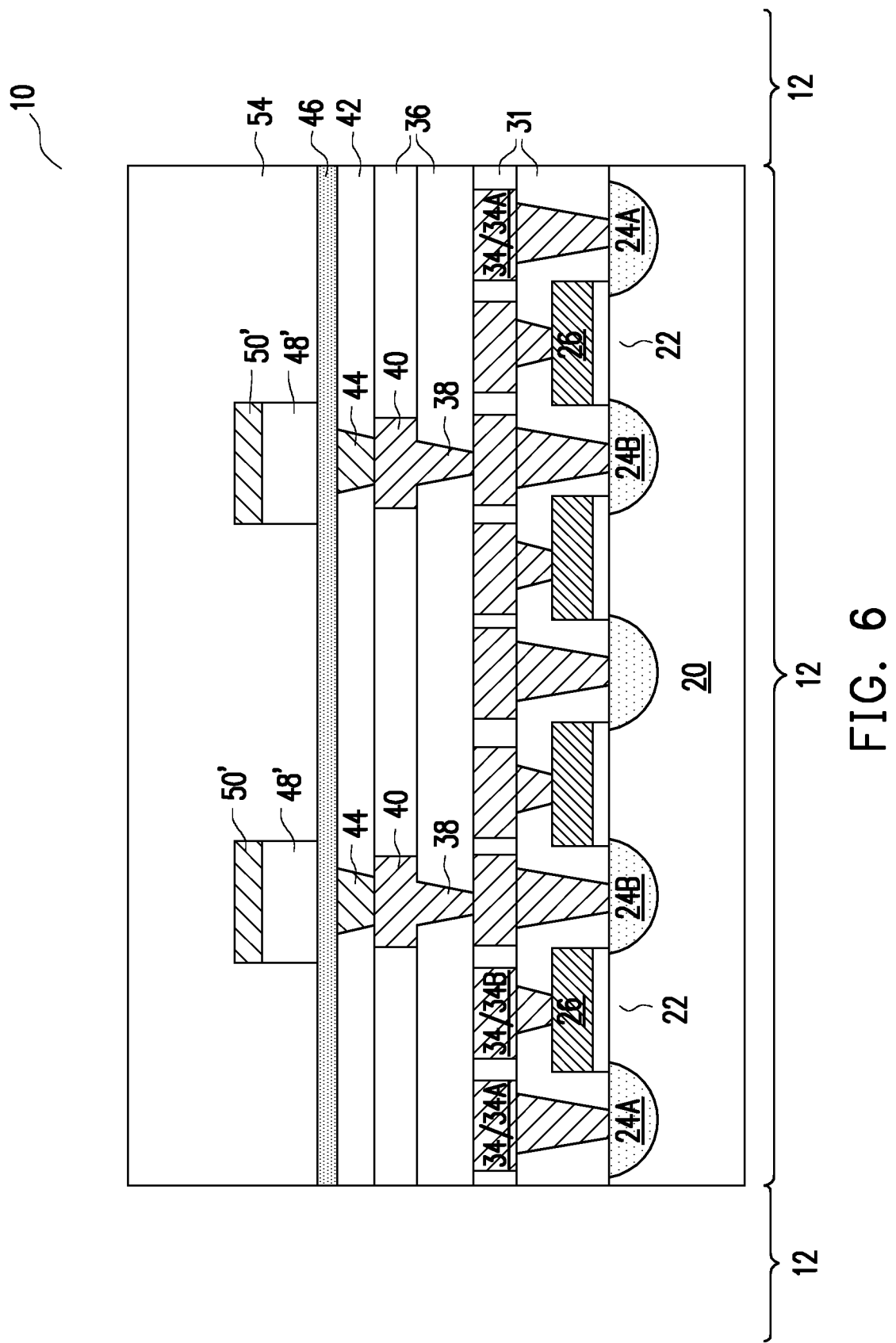

Referring to FIG. 6, dielectric layer 54 is deposited. The respective process is illustrated as process 216 in the process flow 200 shown in FIG. 20. In accordance with some embodiments, dielectric layer 54 is formed of a low-k dielectric material such as a carbon-and-oxygen containing dielectric material. The k-value of dielectric layer 54 may be lower than about 3.0, for example. The top surface of dielectric layer 54 may be higher than the top surface of top electrodes 50'. A planarization process may be performed to level the top surface of dielectric layer 54.

Figure 7:
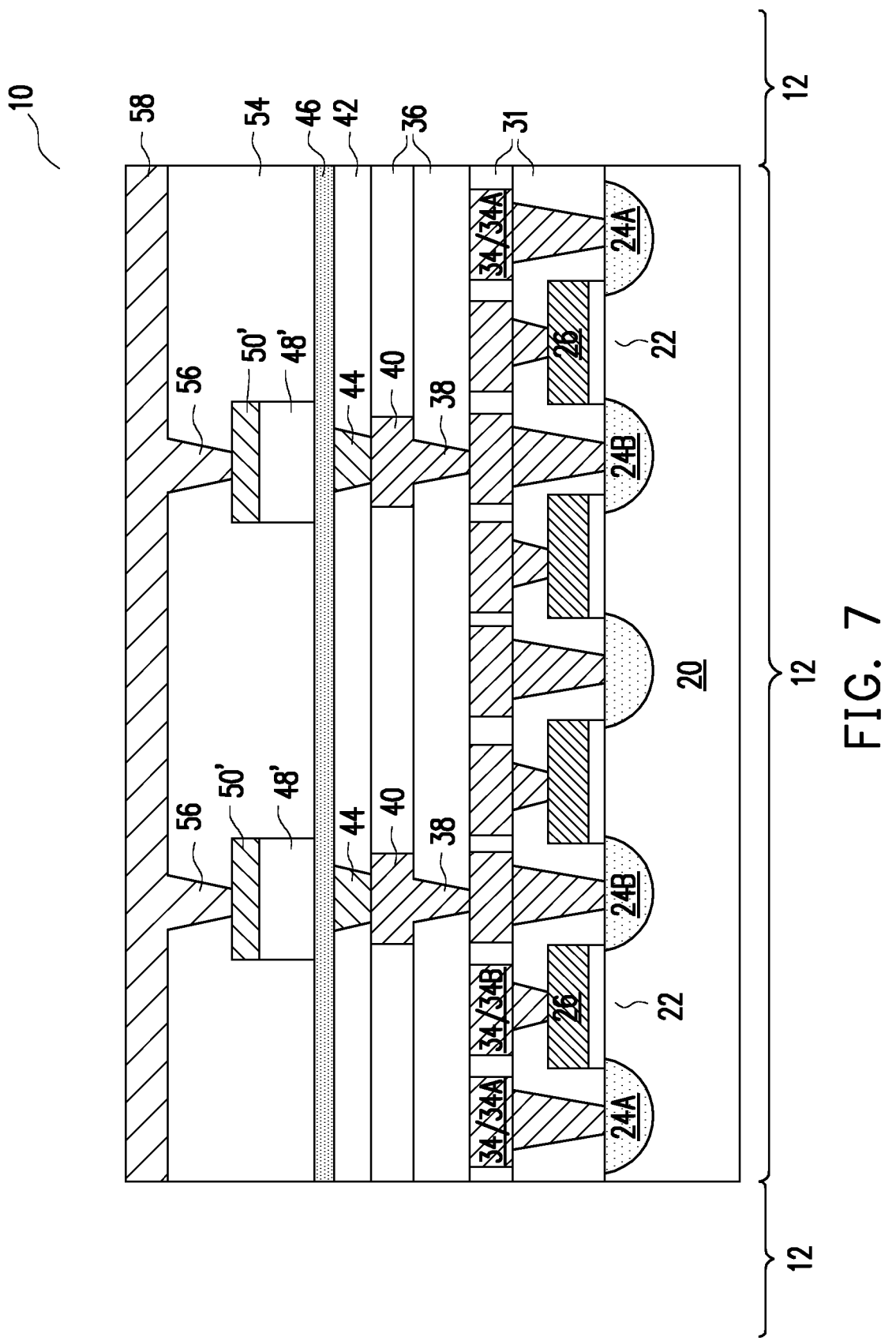

Next, as shown in FIG. 7, vias 56 are formed to contact top electrodes 50'. Metal line 58 is also formed over and joining to vias 56. The respective process is illustrated as process 218 in the process flow 200 shown in FIG. 20. In accordance with some embodiments, metal line 58 and vias 56 are formed in a dual damascene process, which includes etching into dielectric layer 54 to form via openings and trenches joined with the via openings, and filling the trenches and the via openings with a conductive material, followed by performing a planarization process such as a CMP process or a mechanical grind process. Metal line 58 may act as a bit-line of the respective PCRAM array. In subsequent processes, the features overlying metal line 58 and dielectric layer 54 are formed to finish the formation of wafer 10 and the respective die 12. A singulation process is then performed to saw wafer 10 into individual dies 12.

Figure 8:
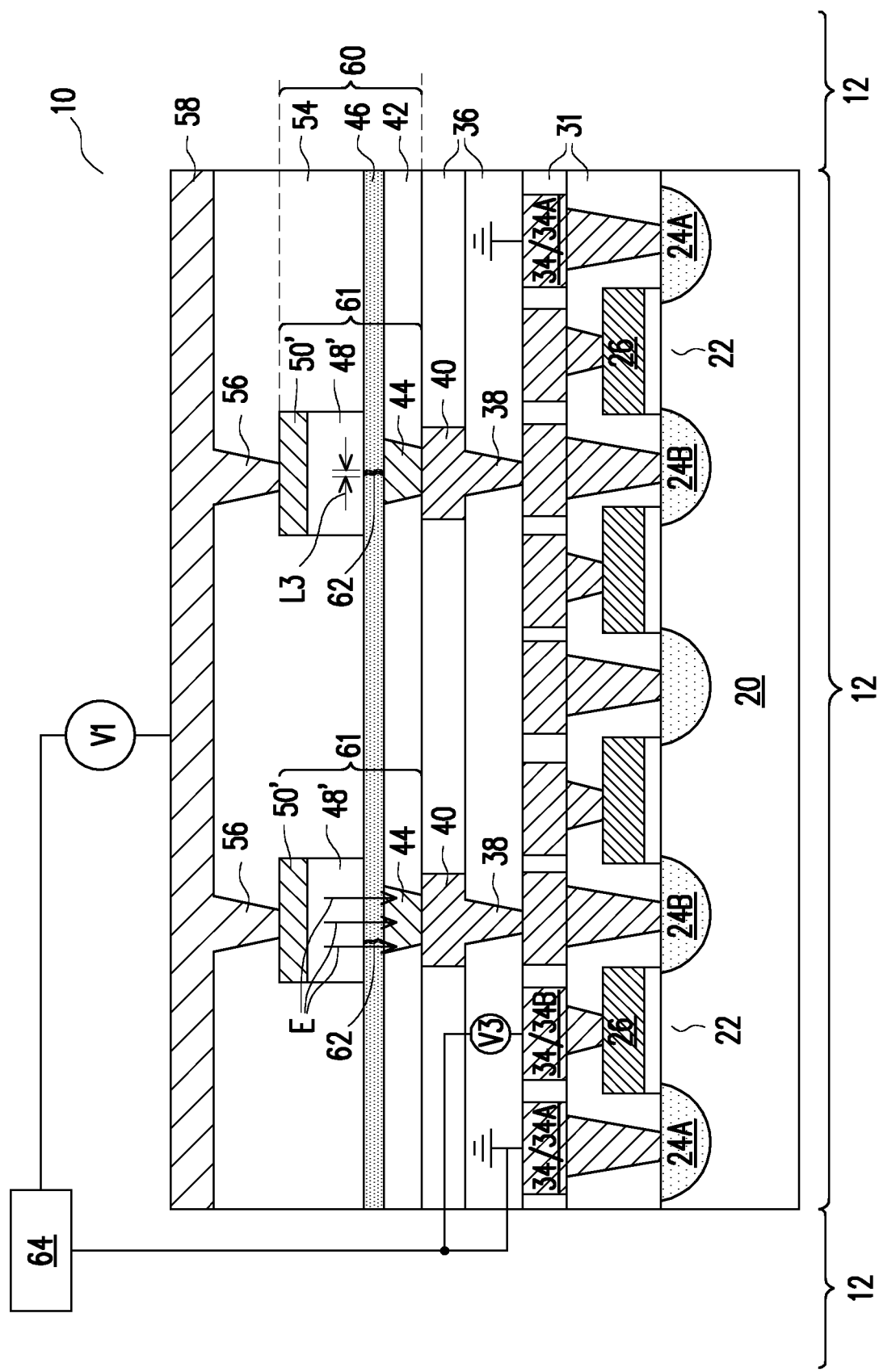

In accordance with some embodiments, at a time after the metal line 58 is formed, the respective PCRAM array do not have heaters contacting phase-change elements 48' since the entirety of ReRAM layer 46 is dielectric. Accordingly, at a time after the formation of metal line 58, a filament-formation process is performed to form filaments 62 as the heaters of the PCRAM array 60, as is shown in FIG. 8. The PCRAM array 60 includes PCRAM cells 61 arranged as an array. The filament-formation process may be performed at any time after the formation of metal line 58, providing it is possible to form filaments for each of the cells in PCRAM array 60. In accordance with some embodiments of the present disclosure, the filament-formation process is performed at wafer level. For example, the filament-formation process may be performed immediately after the formation of metal line 58 and before any overlying feature is formed. The filament-formation process may also be performed after the formation of wafer 10 is finished, and before the singulation process to saw wafer 10 into dies 12. The filament-formation process may also be performed at die level, for example, after dies 12 are packaged into packages, and the filament-formation process may be performed through the external connectors (such as the pins, solder regions, metal pads, or the like) of the dies 12.

FIG. 8 illustrates an example filament-formation process in accordance with some embodiments of the present disclosure. The respective process is illustrated as process 220 in the process flow 200 shown in FIG. 20. In accordance with some embodiments, the filament-formation process (also referred to as a forming operation) is performed by applying a bias voltage V1 on metal line 58 (which may be a bit-line), and grounding source line 34A, which is connected to a source/drain region 24A of selector 22. The gate electrode 26 of the corresponding selector 22 is connected to a word line, which is applied with a proper voltage V3 to turn on the corresponding selector. Accordingly, an electrical field E is applied on a portion of ReRAM layer 46, which portion is between the corresponding phase-change element 48' and via 44. The electrical field E is high enough so that filament 62 is formed in the corresponding portion of ReRAM layer 46. In accordance with some embodiments of the present disclosure, the voltage V1 is in a range between about 2 volts and about 5 volts. It is appreciated that voltage V1 is related to the thickness of ReRAM layer 46, and the thicker the ReRAM layer 46 is, the higher voltage V1 is used. The filament-formation process is performed for each of the phase-change regions 48', so that each of phase-change regions 48' has a filament 62 underlying and contacting it. The formation of filaments 62 for the entire PCRAM array 60 is performed by applying the voltage V1 on each pair of bit-lines BL and word lines WL, and grounding the respective source lines SL.

As a result of the application of electrical field E, filament 62 is generated in ReRAM 46 to connect via 44 to the respective overlying phase-change element 48'. Filament 62 may be formed due to the oxygen vacancies generated in the metal-containing ReRAM layer 46, and the portions of ReRAM layer 46 having the oxygen vacancies are interconnected to form a conductive path. Accordingly, filament 62 includes the same metal(s) as the dielectric portion of ReRAM 46, which metal may include Hf, Zr, Ta, Ti, V, Ni, Nb, La, or combinations thereof.

In accordance with some embodiments, as shown in FIG. 8, PCRAM cells 61 form an array, which includes an array of phase-change elements 48', and an array of filaments 62 contacting the array of phase-change elements. Each of PCRAM cells 61 may include via 44 as a bottom electrode, filament 62 as the heater, phase-change element 48', and top electrode 50'. This means that the array of PCRAM cells 61 includes a ReRAM array, which is formed of filaments 62 and the corresponding dielectric layer 46.

In accordance with some embodiments, filaments 62 have the lateral dimensions L3 smaller than about 10 nm, and the lateral dimensions may be in the range between about 0.5 nm and about 10 nm. Since the formation of filaments 62 may be affected by random factors, unlike the conventional heaters formed of vias, the filaments 62 of different PCRAM cells 61 may be different from each in the sizes, shapes, relative positions, etc. For example, FIG. 8 illustrates an example wherein the filament 62 on the left has a different shape than the filament 62 on the right. Furthermore, filaments 62 have the bottom ends contacting the respective vias 44, and the top ends contacting the respective phase-change elements 48'. The contacting points of filaments 62 to the respective underlying vias 44 and the respective overlying phase-change elements 48', however, may change from PCRAM cell to PCRAM cell, and the relative contacting positions are random. For example, the filament 62 on the left of FIG. 8 contacts the left part of the underlying via 44, while the filament 62 on the right of FIG. 8 contacts the middle of the underlying via 44. It is also likely that a filament 62 may be generated contacting a top corner of the underlying via 44. In addition, a filament 62 may have a shape (in the cross-sectional view) similar to the shape of another filament, or different from the shape of yet another filament. For example, the cross-sectional shape of a filament 62 may be straight, curved, zigzagged, etc. The lateral sizes of filaments 62 may also vary from filament to filament, for example, with the ratio of the width of a wide filament to the width of a narrow filament being greater than about 0.2, and the ratio may be in the range between 1.0 and about 1.4. In accordance with some embodiments, the different shapes, different sizes, different relative positions, etc. of the filaments 62 may all be found in the same PCRAM array 60 in any combination. Overall, filaments 62 are distinguishable from conventionally formed heaters due to their irregular shapes, sizes, positions, etc.

Figure 9:
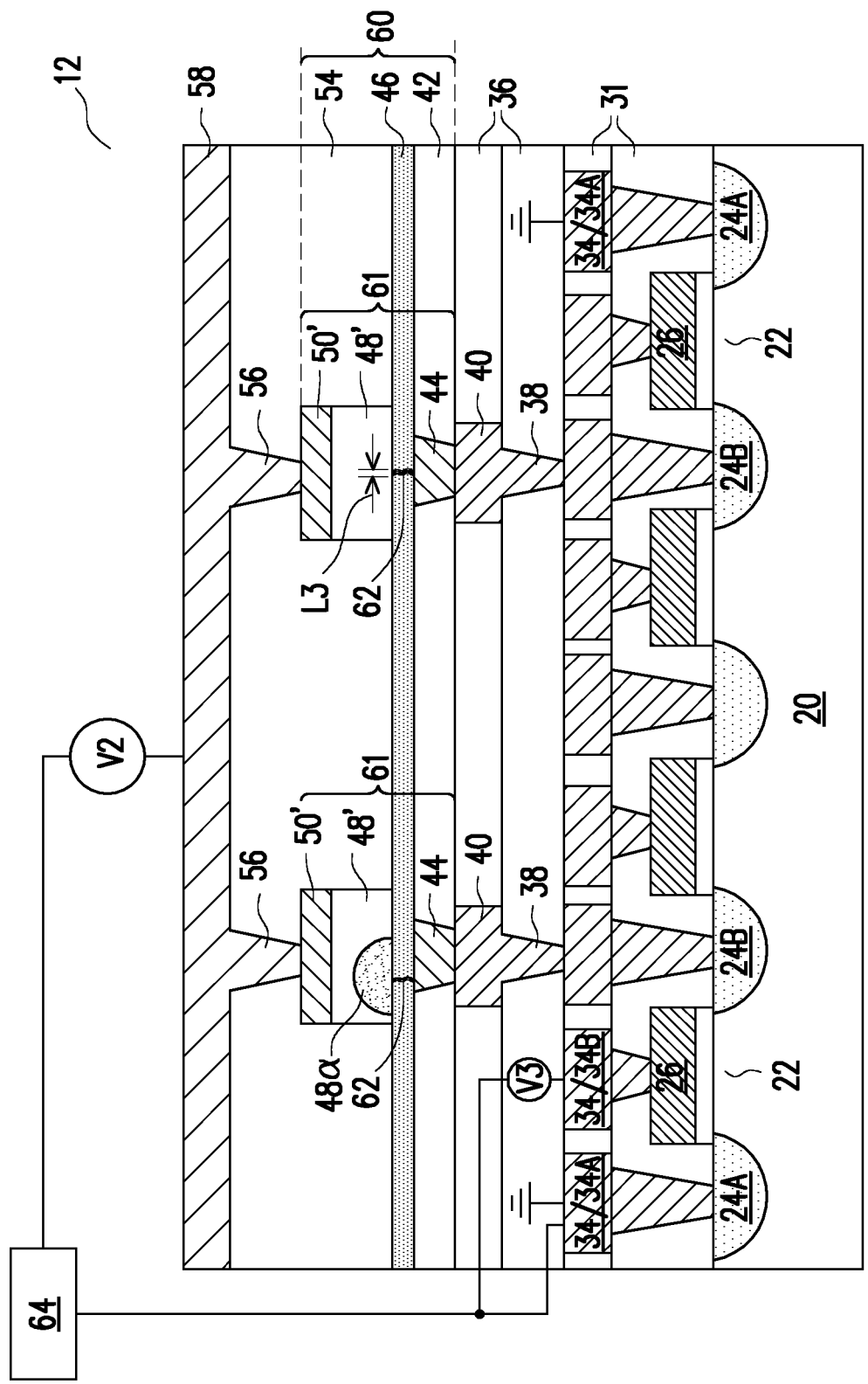
FIG. 9 illustrates an operation performed on a PCRAM cell in accordance with some embodiments.

FIG. 9 illustrates an example of a read operation or a write operation performed on the PCRAM cell 61 on the left of FIG. 9. The respective process is illustrated as process 222 in the process flow 200 shown in FIG. 20. Write operation includes a reset operation, which is to reset the phase-change element 48' into an amorphous phase, and a set operation, which is to set phase-change element 48' to a crystalline phase. To reset the phase-change element 48', a voltage V2 is applied, so that a large electrical current pulse passes through filament 62 for a short time period. The temperature of filament 62 rises due to its relatively high resistivity, causing the melting of a programming region 48α of the phase-change element 48'. The voltage V2 is then quickly reduced to zero, and the temperatures of filament 62 and a programming region 48α in the phase-change element 48' drop rapidly. The molten region 48α thus becomes amorphous and has a high resistivity. The amorphous region 48α is connected in series with any remaining crystalline region of the phase-change element 48', and the amorphous region 48α determines the high resistance of the respective PCRAM cell 61. To set the PCRAM cell 61 into the crystalline phase, a medium electrical current pulse is applied to anneal the amorphous region 48α at a temperature between the crystallization temperature and the melting temperature for a time period long enough to crystallize the amorphous region 48α. To read the state of the PCRAM cell 61, the resistance of the cell is measured by passing an electrical current small enough not to disturb the current state. Voltage V3 is used for selecting the corresponding row of the array for the read or write operation. In accordance with some embodiments, the voltage V2 for the write operation may be in the range between about 1.0 volt and about 3.0 volts, and the voltage V2 for the read operation may be in the range between about 0.3 volt and about 0.9 volt.

After the formation of filaments 62 for all PCRAM cells 61 of the entire PCRAM array 60, and throughout the lifetime of the respective die 12, filaments 62 will remain to keep the PCRAM cells 61 to function. Alternatively stated, once filaments 62 are formed, they will not be dissolved and formed again like in conventional ReRAM cells. This enables filaments 62 to be always available for heating phase-change element 48' during read and write operations. Accordingly, the read and write operations are designed not to dissolve filaments 62, and the bias direction during the read and write operations is always the same as the bias direction for forming filaments 62. For example, assuming the formation of filaments 62 is performed with the voltage applied on bit-line 58 being higher than the voltage applied on the source line 34A, in read and write operations, the voltage applied on bit-line 58 will also be higher than the voltage on the source line 34A. Alternatively stated, the current directions for the filament-formation process, read operations, and write operations are the same. Otherwise, the filaments 62 receiving the reversed bias voltage will dissolve, and the PCRAM array 60 will fail. In accordance with some embodiments, the currents for the filament-formation process, read operations, and write operations are all in the same direction, that is, from bit-line 58 to source line 34A.

In accordance with some embodiments, control circuit 64 is formed to electrically and signally connect to PCRAM array 60. Control circuit 64 is connected to, and is configured to control, the voltage and current sources and the measurement circuits for the filament-formation process, read operation, and the write operations. The control circuit 64 is also configured to control the filament-formation process, the read operation, and the write operations, so that the bias direction for the filament-formation process is the same as the bias directions for the read and write operations.

In above-discussed example filament-formation process as shown in FIG. 8, the bit-line 58 is applied with a higher voltage than source line 34A. In accordance with alternative embodiments, a source-loading scheme is adopted, and the voltage applied on source line 34A is higher than the voltage on bit-line 58. For example, by grounding bit-line 58 and applying a positive voltage on source line 34A. In accordance with these embodiments, during the write and read operations, the voltages applied on source line 34A are also higher than the voltages applied on bit-lines 58. Alternatively stated, the current directions for the filament-formation process, read operation, and write operation are the same, that is, from source line 34A to bit-line 58.

The filaments 62 have small lateral dimensions L3, for example, smaller than about 10 nm. As a comparison, the lateral dimensions of conventional heaters formed using damascene processes or deposition-and-patterning processes are typically greater than 20 nm. The smaller lateral dimensions of filaments 62 means smaller currents may be used for write operations. For example, assuming the lateral dimensions L3 of filaments 62 are 10 nm, and the lateral dimensions of the conventional heaters are 20 nm. The write current of the PCRAM cells in accordance with the embodiments of the present disclosure can be as low as 25 percent the write current used for writing conventional PCRAM cells. When the lateral dimensions L3 of filaments 62 are smaller, even smaller write currents may be adopted.

Figure 10:
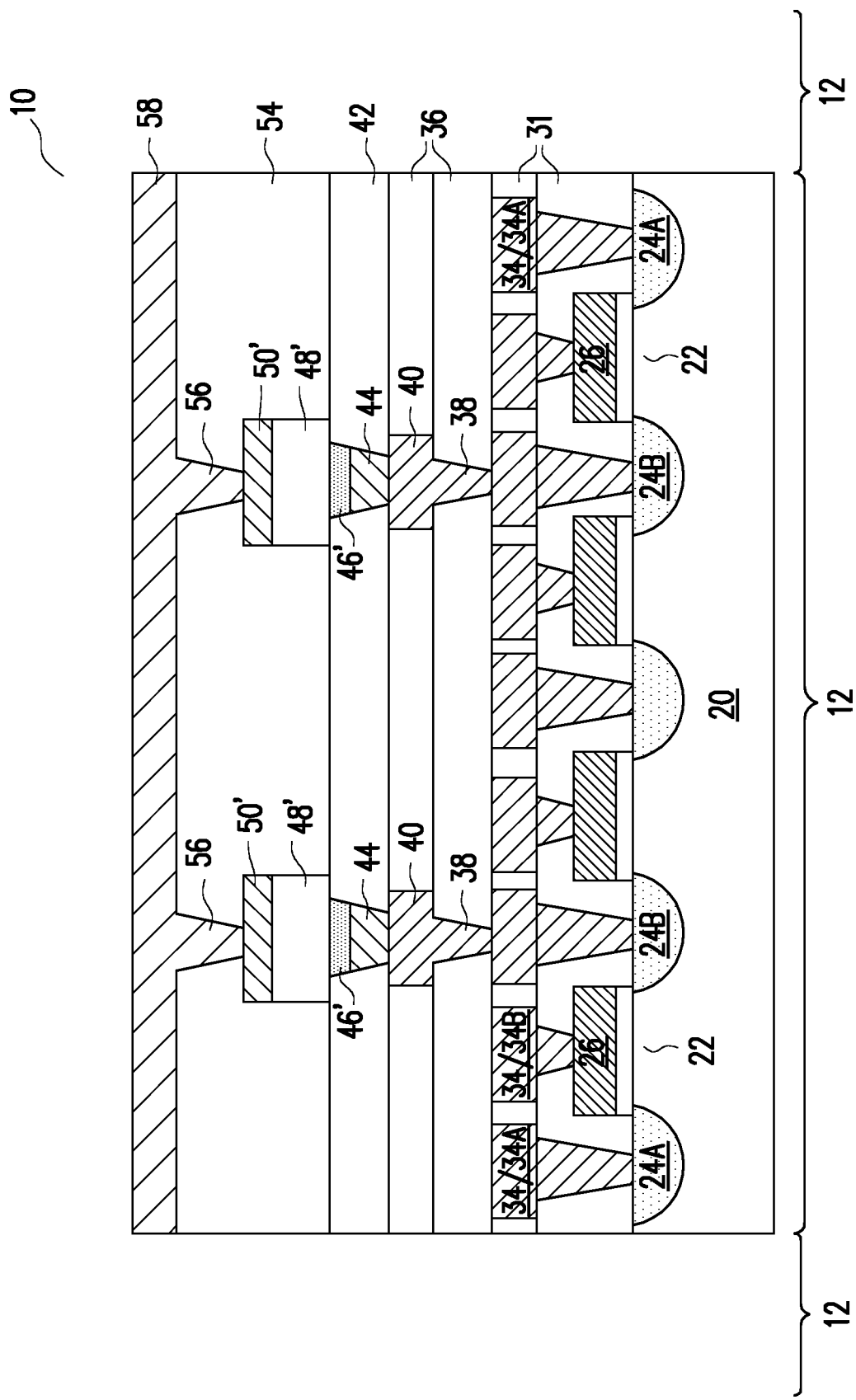
FIGS. 10 through 12 illustrate the cross-sectional views of intermediate stages in the formation and the operation of PCRAM cells in accordance with some embodiments.
Figure 11:
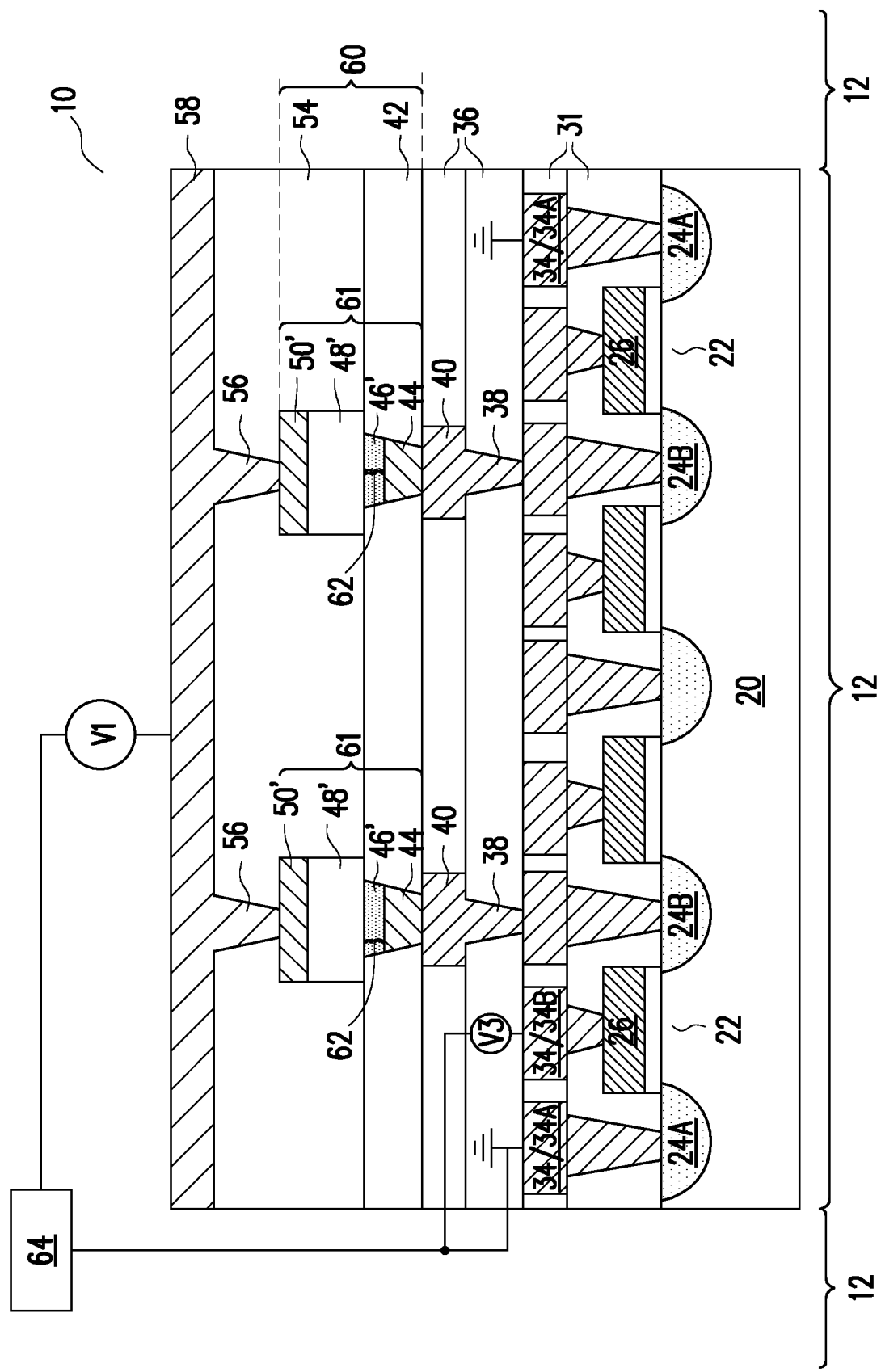
Figure 12:
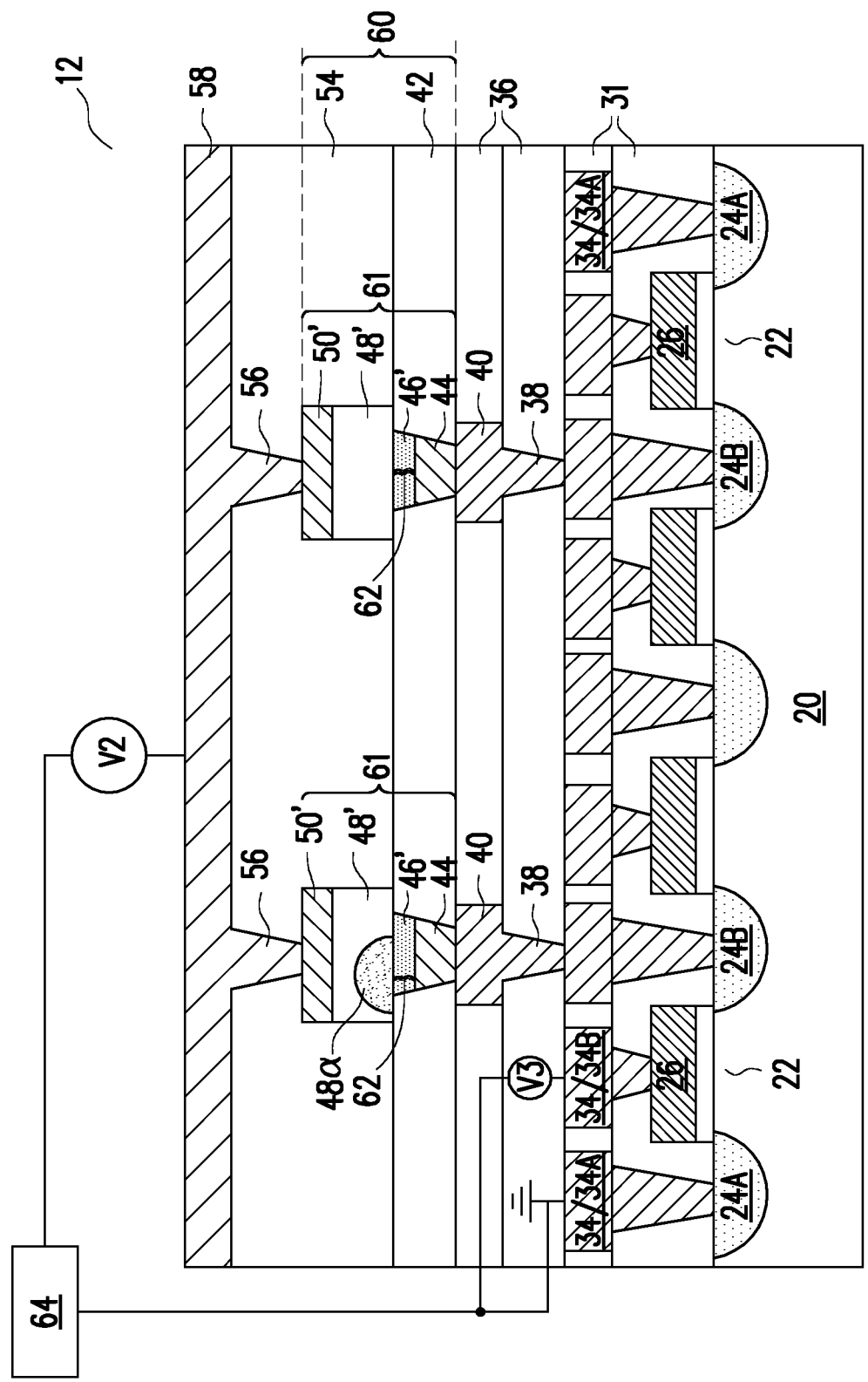

FIGS. 10 through 12 illustrate the cross-sectional views of intermediate stages in the formation and the operation of PCRAM arrays in accordance with other embodiments of the present disclosure. Unless specified otherwise, the materials, the formation processes, and the operations of the components in these embodiments (and the embodiments shown in FIGS. 13 through 18) are essentially the same as the like components, which are denoted by like reference numerals in the preceding embodiments shown in FIGS. 1 through 9. The details regarding the formation process, the operations, and the materials of the components shown in FIGS. 12 through 18 may thus be found in the discussion of the preceding embodiments.

The embodiments shown in FIGS. 10 through 12 are similar to the embodiments shown in FIGS. 1 through 9, except that ReRAM layer 46, instead of being left as a blanket layer, is patterned into an array of ReRAMs 46', each overlapping a via 44. Referring to FIG. 10, a structure is formed by performing processes similar to the processes shown in FIGS. 1 through 7, except the formation of vias 44 and the ReRAMs 46 is different from what are shown in FIGS. 3 through 5. In accordance with some embodiments, a blanket via layer is deposited, followed by the deposition of a blanket ReRAM layer. The blanket via layer and the blanket ReRAM layer are then etched using a same etching mask. The remaining portions of the blanket via layer and the blanket ReRAM layer are vias 44 and ReRAMs 46', respectively. Dielectric layer 42 is then deposited. If ReRAMs 46' are covered by dielectric layer 42, a patterning process may be performed to etch-through the top portions of dielectric layer 42 covering ReRAMs 46', so that ReRAMs 46' are revealed. Next, a process similar to the process shown in FIGS. 4 through 7 is performed to form the rest of PCRAM array 60, and the resulting structure is shown in FIG. 10. In accordance with these embodiments, dielectric layer 42 may, or may not, include top portions covering ReRAMs 46', and if the top portions exist, phase-change elements 48' will extend into the openings in the top portions of dielectric layer 42.

FIG. 11 illustrates the formation of filaments 62 in accordance with some embodiments. The details in the formation of filaments 62 are essentially the same as what are discussed referring to FIG. 8, and are not repeated herein. FIG. 12 illustrates an example write or read process in accordance with some embodiments. The details have been discussed referring to FIG. 9, and are not repeated herein.

Figure 13:
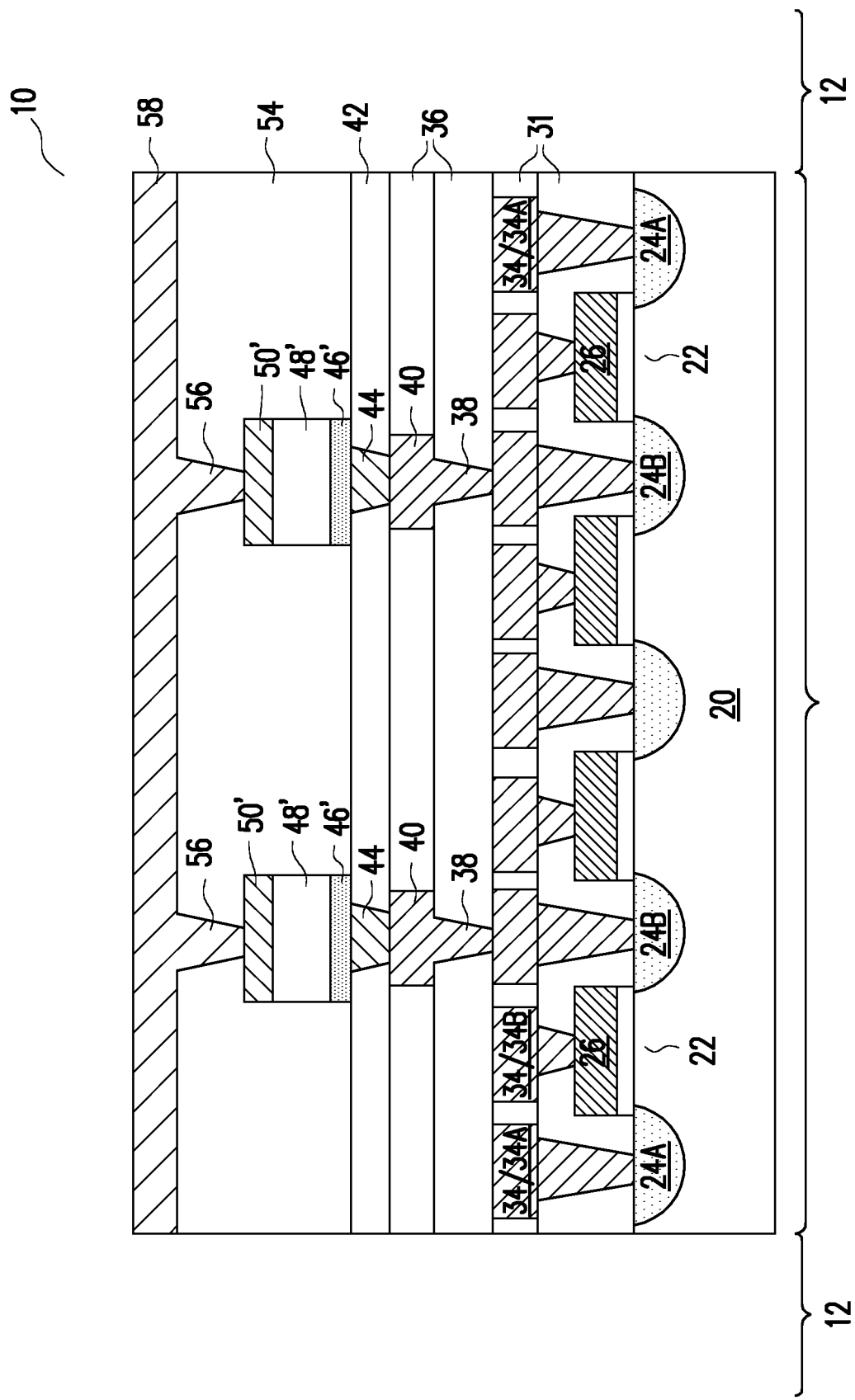
FIGS. 13 through 15 illustrate the cross-sectional views of intermediate stages in the formation and the operation of PCRAM cells in accordance with some embodiments.
Figure 14:
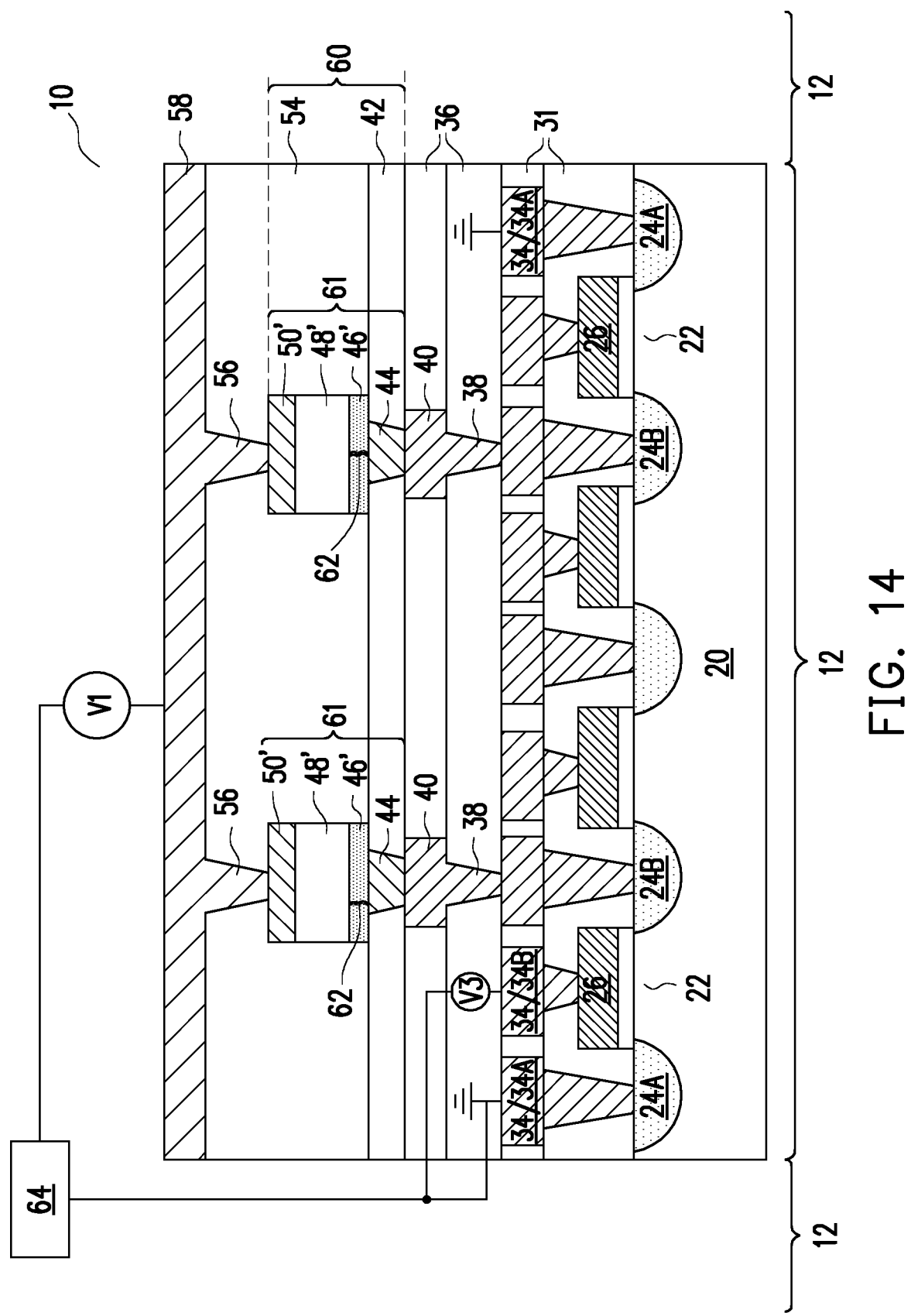
Figure 15:
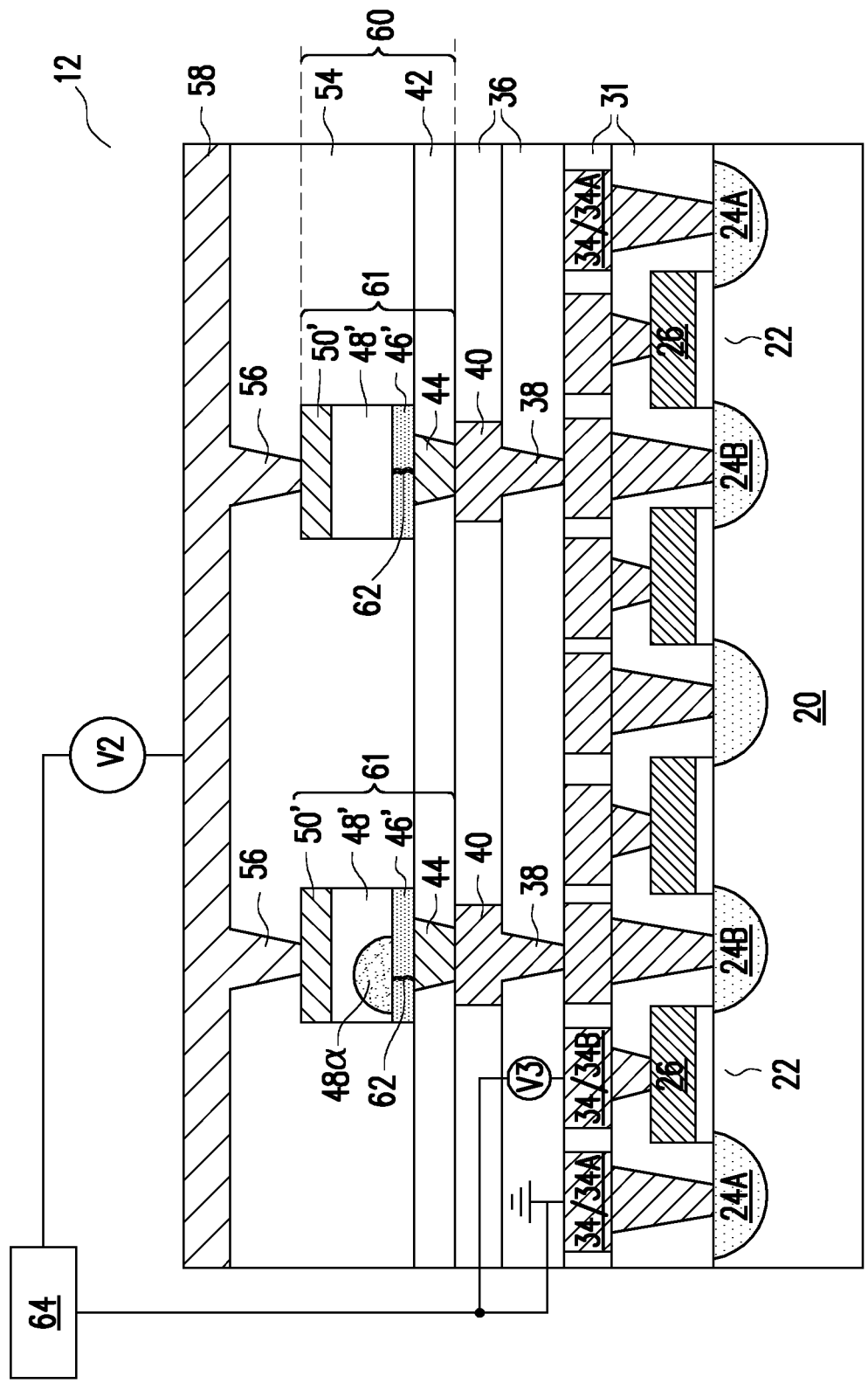

FIGS. 13 through 15 illustrate cross-sectional views of intermediate stages in the formation and the operation of PCRAM arrays in accordance with some embodiments of the present disclosure. These embodiments are similar to the embodiments shown in FIGS. 1 through 9, except that ReRAMs 46' have edges flushed with the respective edges of the overlying phase-change elements 48'. Referring to FIG. 13, a structure is formed by performing processes similar to the processes shown in FIGS. 1 through 4. Next, the ReRAM layer 46, PCRAM layer 48, and top electrode layer 50 as shown in FIG. 4 are patterned in etching processes using a same etching mask. The etching processes may be performed using dielectric layer 42 as the etch stop layer. The remaining portions of the top electrode layer 50, PCRAM layer 48, and ReRAM layer 46 are top electrodes 50', phase-change elements 48', and ReRAMs 46', respectively. Dielectric layer 54 is then formed. In subsequent processes, the process shown in FIGS. 6 and 7 are performed, and the resulting structure is shown in FIG. 13.

FIG. 14 illustrates the formation of filaments 62 in accordance with some embodiments. The details of the formation of filaments 62 are essentially the same as what have been discussed referring to FIG. 8, and are not repeated herein. FIG. 15 illustrates an example write operation or read operation in accordance with some embodiments. The details have been discussed referring to FIG. 9, and are not repeated herein.

Figure 16:
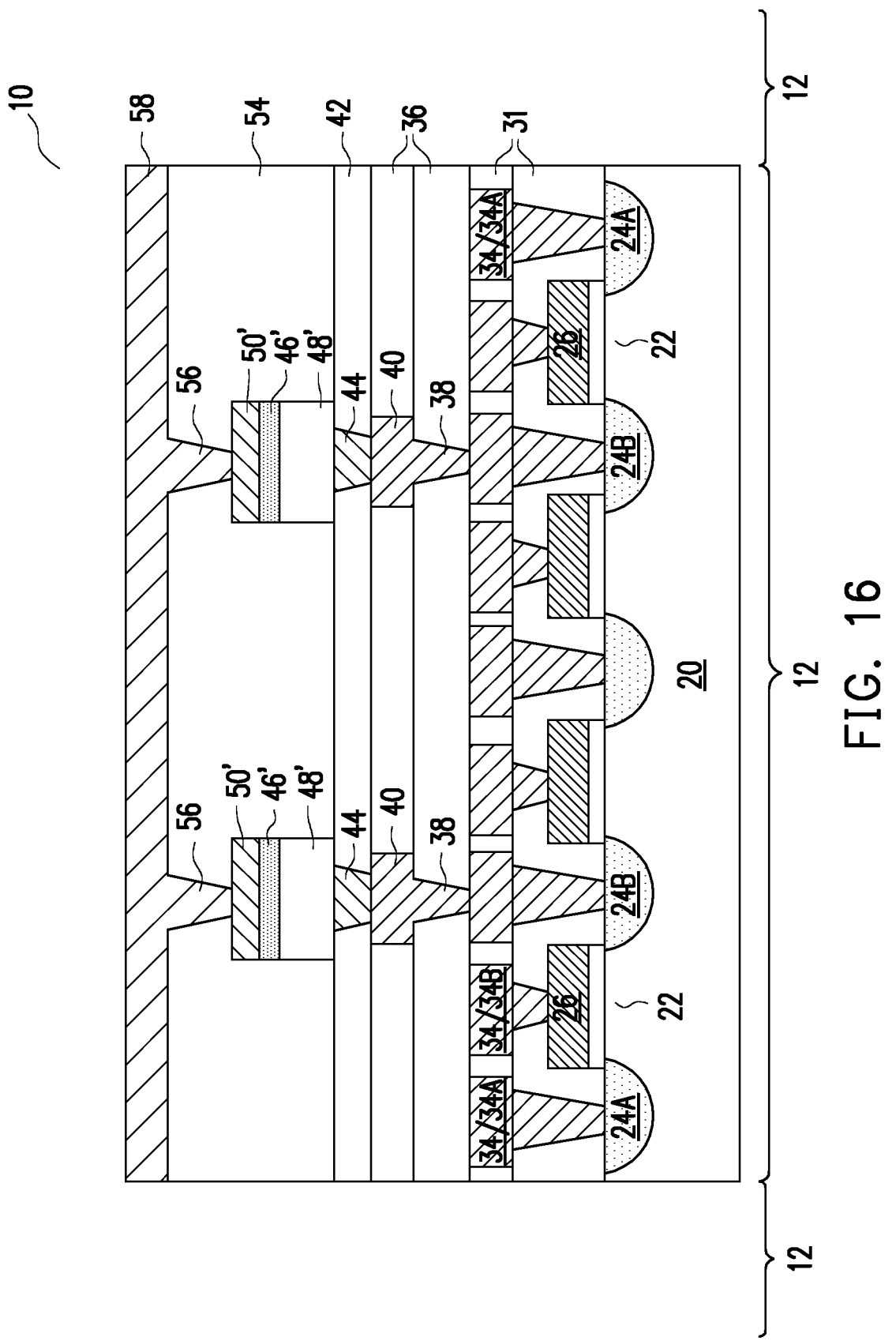
FIGS. 16 through 18 illustrate the cross-sectional views of intermediate stages in the formation and the operation of PCRAM cells in accordance with some embodiments.
Figure 17:
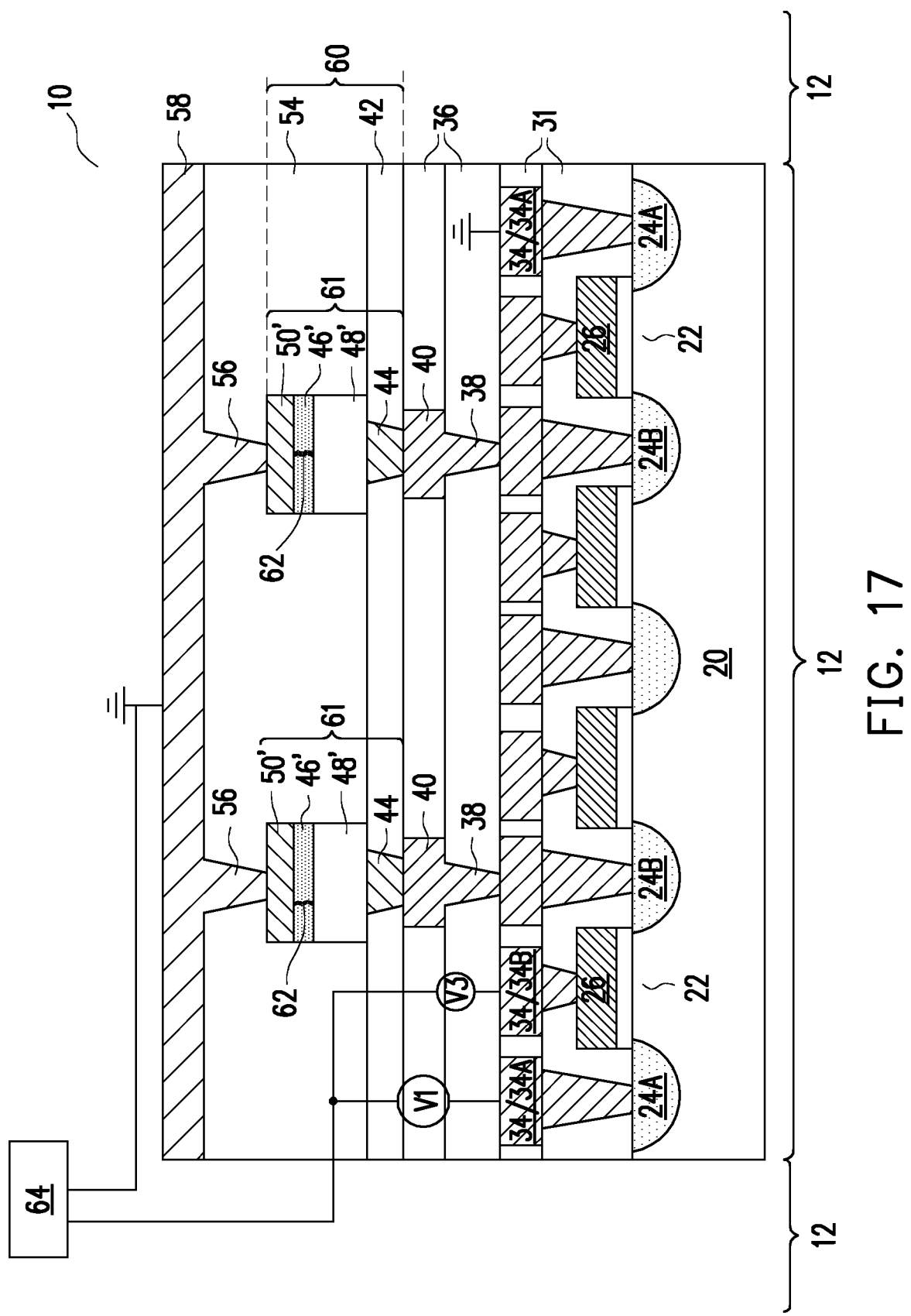
Figure 18:
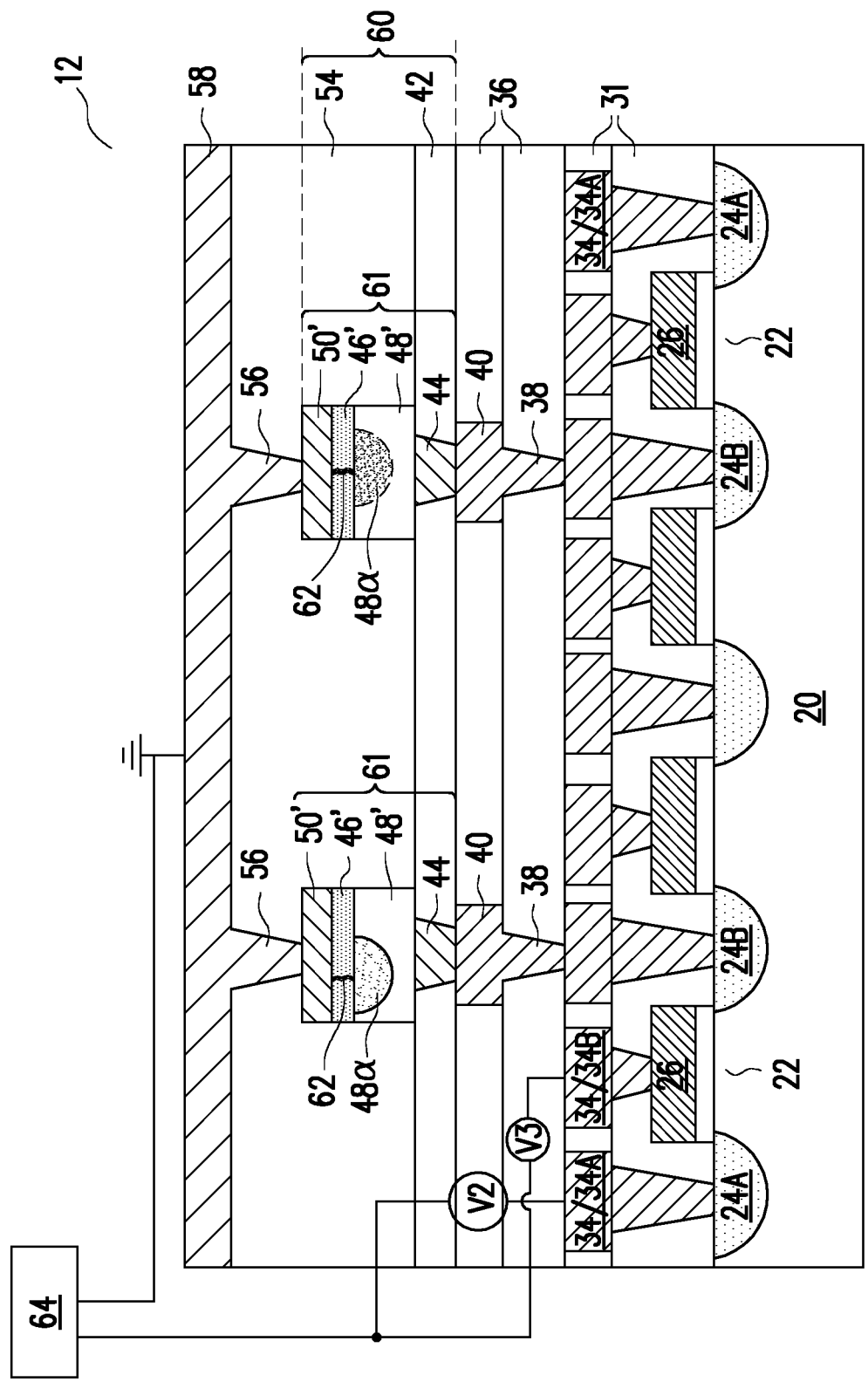

FIGS. 16 through 18 illustrate cross-sectional views of intermediate stages in the formation and the operation of PCRAM arrays in accordance with some embodiments of the present disclosure. These embodiments are similar to the embodiments shown in FIG. 13, except that ReRAMs 46' are formed overlying, rather than underlying, phase-change elements 48'. The initial formation processes are shown in FIGS. 1 through 3. Next, PCRAM layer 48, top electrode layer 50, and the ReRAM layer 46 are formed. The structure is similar to the structure shown in FIG. 4, except that ReRAM layer 46 is overlying, rather than underlying, PCRAM layer 48. Next, top electrode layer 50, ReRAM layer 46, and PCRAM layer 48 are patterned in etching processes using a same etching mask. The etching processes may be performed using dielectric layer 42 as the etch stop layer. The remaining portions of the top electrode layer 50, ReRAM layer 46, and PCRAM layer 48 are top electrodes 50', ReRAMs 46', and phase-change elements 48', respectively, as shown in FIG. 16. Dielectric layer 54 is then formed. In subsequent processes, the process shown in FIGS. 6 and 7 are performed, and the resulting structure is shown in FIG. 16.

FIG. 17 illustrates the formation of filaments 62 in accordance with some embodiments. As shown in FIG. 17, the formation of filaments 62 may be performed through source loading, wherein a positive voltage V1 is applied on source line 34A, and bit-line 58 is electrically grounded. In accordance with alternative embodiments, the formation of filaments 62 may be performed by applying a positive voltage V1 on bit-line 58, and source line 34A is electrically grounded. The details of the formation of filaments 62 are essentially the same as discussed referring to FIG. 8, and are not repeated herein.

FIG. 18 illustrates an example write or read operation. In accordance with some embodiments of the present disclosure, as shown in FIG. 18, the write operation or the read operation is performed through source loading, wherein a positive voltage V2 is applied on source line 34A, and bit-line 58 is electrically grounded. In accordance with alternative embodiments, the write operation or the read operation is performed by applying a positive voltage V2 on bit-line 58, and source line 34A is electrically grounded. The details are discussed referring to FIG. 9, and are not repeated herein. It is appreciated that the bias directions for write and read operations are still the same as the bias direction for forming filaments 62. Otherwise, filaments will be dissolved.

FIG. 19 schematically illustrates a perspective view of the PCRAM array 60, which includes bit lines 58. ReRAMs 46' are formed underlying and connected to bit lines 58. It is appreciated that although ReRAMs 46' are illustrated as discrete elements of an array, ReRAMs 46' may also be parts of a continuous and blank dielectric layer. Top electrodes 50' and phase-change elements 48' are also illustrated schematically. Vias 44 (FIGS. 9, 12, 15, and 18) are not shown in FIG. 19.

The embodiments of the present disclosure have some advantageous features. By forming filaments of ReRAMs and using the filaments as the heaters of PCRAMs, the heaters are made much narrower than the conventional heaters formed using conventional heater formation processes. The write currents required for writing operations are significantly reduced.

In accordance with some embodiments of the present disclosure, a method includes forming a bottom electrode; forming a dielectric layer; forming a PCRAM region in contact with the dielectric layer; forming a top electrode, wherein the dielectric layer and the PCRAM region are between the bottom electrode and the top electrode; and forming a filament in the dielectric layer, wherein the filament is in contact with the dielectric layer. In an embodiment, the forming the PCRAM region comprises depositing a chalcogenide semiconductor material. In an embodiment, the forming the filament comprises applying an electrical field on the dielectric layer to generate the filament. In an embodiment, the method further comprises writing the PCRAM region or reading a status of the PCRAM by conducting a current through the PCRAM region, wherein a first direction of the current is same as a second direction of the electrical field. In an embodiment, the forming the dielectric layer comprises depositing a material selected from the group consisting of $HfO_x$, $ZrO_x$, $TaO_x$, $TiO_x$, $VO_x$, $NiO_x$, $NbO_x$, $LaO_x$, and combinations thereof. In an embodiment, the method further comprises forming a memory array comprising forming a first array of PCRAM regions, with the PCRAM region being one array element in the array of PCRAM regions; and forming an array of filaments contacting the array of PCRAM regions, with the filament being an additional array element in the array of filaments. In an embodiment, the PCRAM region is over the dielectric layer, and wherein at a time the filament is formed, the dielectric layer extends laterally beyond the PCRAM region. In an embodiment, the PCRAM region is over the dielectric layer, and the method further comprises depositing a blanket PCRAM layer; and patterning the blanket PCRAM layer and the dielectric layer using a same etching mask, wherein the blanket PCRAM layer is patterned into a plurality of PCRAM regions comprising the PCRAM region.

In accordance with some embodiments of the present disclosure, a structure includes an array of memory cells, wherein each memory cell in the array of memory cells comprises a bottom electrode; a dielectric layer; a filament in the dielectric layer; a PCRAM region in contact with the dielectric layer and the filament; and a top electrode, wherein the dielectric layer and the PCRAM region are between the bottom electrode and the top electrode. In an embodiment, the dielectric layer and the filament comprise a same metal. In an embodiment, the PCRAM region comprises a chalcogenide semiconductor material. In an embodiment, filaments of different memory cells in the array of memory cells have different shapes. In an embodiment, filaments of different memory cells in the array of memory cells have different relative positions with relative to the bottom electrodes in corresponding memory cells. In an embodiment, the dielectric layers of the array of memory cells are portions of a continuous dielectric layer extending throughout the array of memory cells. In an embodiment, the dielectric layers of the array of memory cells are separated from each other by an additional dielectric region.

In accordance with some embodiments of the present disclosure, a structure comprises a plurality of bottom electrodes; a dielectric layer over and contacting the plurality of bottom electrodes; a plurality of filaments in the dielectric layer, wherein each of the plurality of filaments overlaps a corresponding one of the plurality of bottom electrodes; a plurality of chalcogenide semiconductor regions, wherein each of the plurality of chalcogenide semiconductor regions overlaps and contacts a corresponding one of the plurality of filaments; and a plurality of top electrodes overlying the plurality of chalcogenide semiconductor regions. In an embodiment, the plurality of filaments penetrate through the dielectric layer. In an embodiment, the plurality of filaments have different relative positions with respective to corresponding underlying ones of the plurality of bottom electrodes. In an embodiment, the plurality of filaments have lateral dimensions smaller than about 10 nm. In an embodiment, the dielectric layer has a thickness in a range between about 3 nm and about 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a bottom electrode;
   forming a dielectric layer;
   forming a Phase-Change Random Access Memory (PCRAM) region in physical contact with, and directly touching, a top surface of the dielectric layer, and wherein the dielectric layer extends laterally beyond edges of the PCRAM region;
   forming a top electrode, wherein the dielectric layer and the PCRAM region are between the bottom electrode and the top electrode; and
   forming a filament in the dielectric layer, wherein the filament is in contact with the dielectric layer.

2. The method of claim 1, wherein the forming the PCRAM region comprises depositing a chalcogenide semiconductor material.

3. The method of claim 1, wherein the forming the filament comprises applying an electrical field on the dielectric layer to generate the filament.

4. The method of claim 3, further comprising writing the PCRAM region or reading a status of the PCRAM by conducting a current through the PCRAM region, wherein a first direction of the current is same as a second direction of the electrical field.

5. The method of claim 1, wherein the forming the dielectric layer comprises depositing a material selected from the group consisting of $HfO_x$, $ZrO_x$, $TaO_x$, $TiO_x$, $VO_x$, $NiO_x$, $NbO_x$, $LaO_x$, and combinations thereof.

6. The method of claim 1 comprising forming a memory array comprising:
   forming a first array of PCRAM regions, with the PCRAM region being one array element in the first array of PCRAM regions, wherein the dielectric layer is a continuous layer that extends underlying, and in physical contact with, bottom surfaces of all PCRAM regions in the first array; and forming second array of filaments contacting the first array of PCRAM regions, with the filament being an additional array element in the second array of filaments.

7. The method of claim 1, wherein the PCRAM region is over the dielectric layer, and wherein at a time the filament is formed, the dielectric layer that is in physical contact with the PCRAM region comprises edges vertically aligned to respective edges of the PCRAM region.

8. The method of claim 1, wherein the PCRAM region is over the dielectric layer, and the method further comprises:
   depositing a blanket PCRAM layer; and
   patterning the blanket PCRAM layer and the dielectric layer using a same etching mask, wherein the blanket PCRAM layer is patterned into a plurality of PCRAM regions comprising the PCRAM region.

9. The method of claim 1 further comprising forming an additional dielectric layer, with the bottom electrode being in the additional dielectric layer, wherein a bottom surface of the dielectric layer is in direct contact with a top surface of the bottom electrode and a top surface of the additional dielectric layer.

10. A structure comprising:
    an array of memory cells, wherein each memory cell in the array of memory cells comprises:
       a bottom electrode;
       a dielectric layer;
       a filament in the dielectric layer;
       a Phase-Change Random Access Memory (PCRAM) region in direct contact with the dielectric layer and the filament, wherein the dielectric layers of the array of memory cells are interconnected as a continuous dielectric layer; and
       a top electrode, wherein the dielectric layer and the PCRAM region are between the bottom electrode and the top electrode.

11. The structure of claim 10, wherein the dielectric layer and the filament comprise a same metal.

12. The structure of claim 10, wherein the PCRAM region comprises a chalcogenide semiconductor material.

13. The structure of claim 10, wherein filaments of different memory cells in the array of memory cells have different shapes.

14. The structure of claim 10, wherein filaments of different memory cells in the array of memory cells have different relative positions with relative to the bottom electrodes in corresponding memory cells.

15. The structure of claim 10, wherein the dielectric layers of the array of memory cells comprise a metal oxide.

16. The structure of claim 10, wherein the dielectric layers of the array of memory cells comprise a high-k dielectric material.

17. A structure comprising:
    a plurality of bottom electrodes;
    a dielectric layer over and physically contacting the plurality of bottom electrodes;
    a plurality of filaments in the dielectric layer, wherein each of the plurality of filaments overlaps a corresponding one of the plurality of bottom electrodes, wherein the plurality of filaments comprise a same metal as the dielectric layer, with oxygen vacancies formed and interconnected to form the plurality of filaments;
    a plurality of chalcogenide semiconductor regions, wherein each of the plurality of chalcogenide semiconductor regions overlaps and contacts a corresponding one of the plurality of filaments, wherein the dielectric layer is a continuous layer that directly contacts the plurality of chalcogenide semiconductor regions; and
    a plurality of top electrodes overlying the plurality of chalcogenide semiconductor regions.

18. The structure of claim 17, wherein the plurality of filaments have different relative positions with respective to corresponding underlying ones of the plurality of bottom electrodes.

19. The structure of claim 17, wherein the dielectric layer comprises a plurality of portions, each overlying or underlying one of the plurality of chalcogenide semiconductor regions, and wherein edges of the plurality of portions of the dielectric layer are vertically aligned to respective edges of the plurality of chalcogenide semiconductor regions.

20. The structure of claim 17, wherein the dielectric layer has a thickness in a range between about 3 nm and about 10 nm.

* * * * *